United States Patent
Kim et al.

(10) Patent No.: US 11,656,545 B2
(45) Date of Patent: May 23, 2023

(54) ROLL STAMP FOR IMPRINT DEVICE, AND MANUFACTURING METHOD THEREFOR

(71) Applicant: KOREA INSTITUTE OF MACHINERY & MATERIALS, Daejeon (KR)

(72) Inventors: Man Kim, Changwon-si (KR); Joo Yul Lee, Gimhae-si (KR); Sang Yeoul Lee, Gimhae-si (KR); Ju Yeong Lee, Changwon-si (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 290 days.

(21) Appl. No.: 16/764,483

(22) PCT Filed: Nov. 15, 2018

(86) PCT No.: PCT/KR2018/013999
§ 371 (c)(1),
(2) Date: May 15, 2020

(87) PCT Pub. No.: WO2019/098705
PCT Pub. Date: May 23, 2019

(65) Prior Publication Data
US 2020/0355998 A1  Nov. 12, 2020

(30) Foreign Application Priority Data

Nov. 20, 2017 (KR) .......................... 10-2017-0154668
Nov. 20, 2017 (KR) .......................... 10-2017-0154673
(Continued)

(51) Int. Cl.
*G03F 7/00* (2006.01)
*C25D 1/10* (2006.01)
(Continued)

(52) U.S. Cl.
CPC ........ *G03F 7/0002* (2013.01); *B29C 33/3878* (2013.01); *B29C 33/42* (2013.01);
(Continued)

(58) Field of Classification Search
CPC ..... B29C 33/38; B29C 33/3878; B29C 33/42; B29C 59/022; B29C 59/04; G03F 7/0002;
(Continued)

(56) References Cited

U.S. PATENT DOCUMENTS

2005/0082700 A1* 4/2005 Deeman .................. C25D 1/00
                                                  205/70
2008/0106001 A1* 5/2008 Slafer .................... B29C 33/30
                                                  425/142
(Continued)

FOREIGN PATENT DOCUMENTS

JP      05-016230       1/1993
JP      2003-205564     7/2003
(Continued)

*Primary Examiner* — Jerzi H Moreno Hernandez
(74) *Attorney, Agent, or Firm* — Lex IP Meister, PLLC

(57) ABSTRACT

The present invention relates to a roll stamp and a method of manufacturing the same, the roll stamp including a cylindrical metal mold including a debossed pattern formed on an outer side and a hollow portion formed on an inner side, and a dummy roller inserted into the hollow portion. Because a joining portion is not formed on the entire area of the cylindrical metal mold, a problem in which edge regions are separated does not occur. Also, due to the absence of the joining portion, it is possible to perform a patterning process continuously.

8 Claims, 31 Drawing Sheets

(30) Foreign Application Priority Data

Jun. 21, 2018 (KR) .................. 10-2018-0071534
Jun. 21, 2018 (KR) .................. 10-2018-0071553

(51) Int. Cl.
*C23C 18/16* (2006.01)
*B29C 33/38* (2006.01)
*B29C 59/04* (2006.01)
*B29C 33/42* (2006.01)

(52) U.S. Cl.
CPC .......... *B29C 59/04* (2013.01); *C23C 18/1651* (2013.01); *C23C 18/1653* (2013.01); *C25D 1/10* (2013.01)

(58) Field of Classification Search
CPC ............ C23C 18/1651; C23C 18/1653; C23C 18/1657; C25D 1/10
See application file for complete search history.

(56) References Cited

U.S. PATENT DOCUMENTS

| | | | |
|---|---|---|---|
| 2013/0019766 A1* | 1/2013 | Mahnad et al. | ........ B29C 59/02 156/60 |
| 2015/0108000 A1 | 4/2015 | Lee et al. | |
| 2016/0009023 A1* | 1/2016 | Mahnad | .............. B29C 33/3878 29/895.2 |

FOREIGN PATENT DOCUMENTS

| | | | |
|---|---|---|---|
| JP | 2005-153271 | | 6/2005 |
| JP | 2012-195600 | | 10/2012 |
| JP | 2012195600 A | * | 10/2012 |
| JP | 2016144874 | | 8/2016 |

* cited by examiner

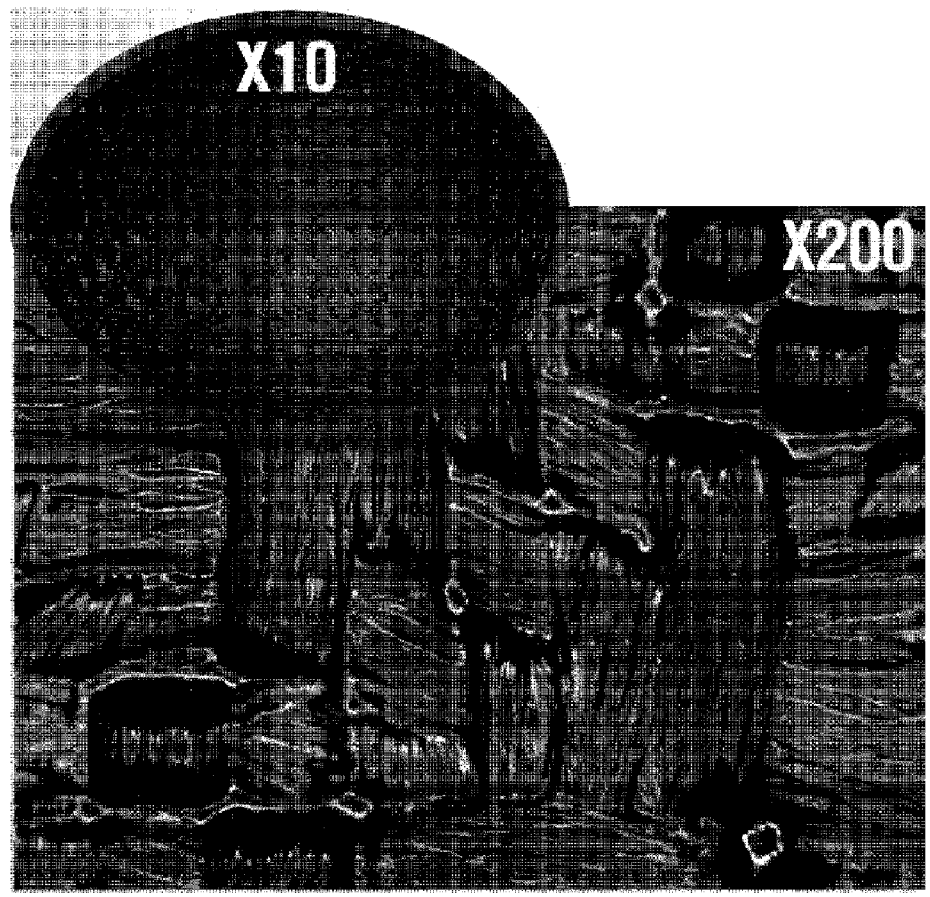
FIG. 26
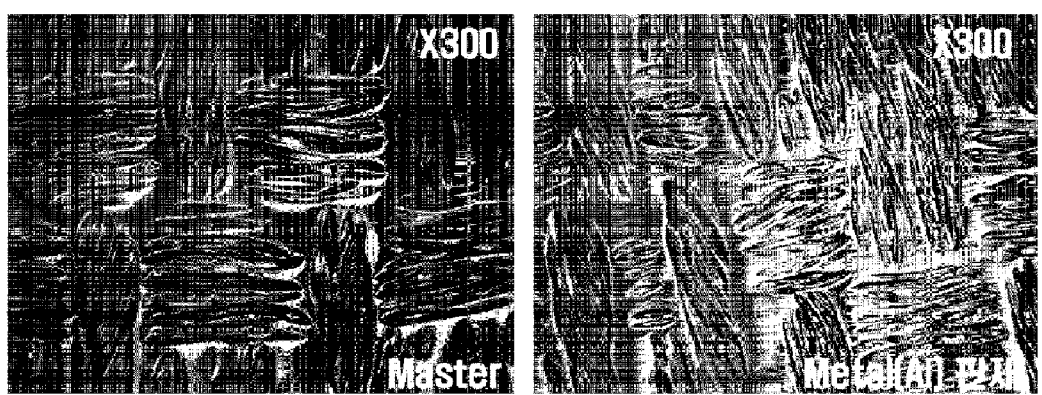

ROLL STAMP FOR IMPRINT DEVICE, AND MANUFACTURING METHOD THEREFOR

TECHNICAL FIELD

The present invention relates to a roll stamp for an imprint apparatus and a method of manufacturing the same, and more particularly, to a roll stamp which is capable of forming fine patterns without a seam throughout the entire area of the roll stamp, and a method of manufacturing the same.

BACKGROUND ART

Along with information technology (IT) and biotechnology (BT), nanotechnology (NT) has gained attention as a new paradigm technology that will lead industrial development of the 21$^{st}$ century. The nanotechnology is expected to dramatically improve the quality of life of mankind by overcoming the limitations of existing technologies by integrating with various science and technology fields such as physics, chemistry, biology, electrical engineering, and material engineering.

Nanotechnology is largely classified into a top-down approach and a bottom-up approach, according to a method of approach. The top-down approach is, as can be seen in the history of semiconductor integrated devices which have been developed over the past several decades, a technology that seeks to continue to increase information storage capacity and information processing speed by further developing the existing microstructure fabrication technology to the nanometer scale.

In contrast, the bottom-up approach is a technology that seeks to induce new physical and chemical properties, which are not possible with existing technologies, by controlling substances at the atomic or molecular level or using a spontaneous nanostructure formation phenomenon and use the induced new physical and chemical properties to fabricate new materials and devices.

Optical lithography technology, which is used in conventional semiconductor device manufacturing processes, is a typical example of the top-down approach. The technological advancement of the 20$^{th}$ century, which is referred to as "information technology revolution," has relied heavily on miniaturization and integration of semiconductor devices, and the core technology of the semiconductor device manufacturing process is the optical lithography technology. However, the optical lithography technology has a disadvantage in that it is difficult to produce a pitch of 100 nm or less due to a limitation in a line width that is due to characteristics of diffraction and refraction of light. Thus, in recent years, there have been many attempts to develop a process using nanoimprint technology.

Nanoimprint technology, which is a nanodevice fabrication method introduced by Professor Stephen Chou of Princeton University in the mid-1990s, has gained attention as a technology capable of compensating for the low productivity of electron beam lithography and disadvantages of high-cost lithography equipment.

That is, using the nanoimprint technology, a stamp having a nano-scale pattern is fabricated, and the stamp is pressed onto a predetermined plate material, thereby transferring the nano-scale pattern onto the plate material. Such a stamp having a pattern has been generally recognized as a flat plate stamp in which a pattern is formed on a flat surface.

Nevertheless, there has been an effort to fabricate a roll stamp having a pattern, along with the flat plate stamp, using the nanoimprint technology. This is because, theoretically, the roll stamp having a pattern is able to perform patterning continuously while rotating so that not only patterning on a large area is facilitated, but also the productivity thereof is expected to be improved.

FIGS. 1 to 3 are schematic diagrams illustrating a first method of manufacturing a conventional roll stamp.

First, referring to FIG. 1, in the first method of manufacturing a conventional roll stamp, a cylindrical dummy roller (10) is provided. Here, the dummy roller (10) includes an outer surface (11).

Next, referring to FIG. 2, a flat plate-shaped plate (20) is provided. Here, the plate (20) includes a first surface (21) and a second surface (23) corresponding to the first surface (21), and a pattern (22) to be transferred is formed on any one of the first surface (21) and the second surface (23), e.g., the first surface (21).

Next, referring to FIG. 3, by rolling the flat plate-shaped plate (20) into a cylindrical shape so that the second surface (23) of the flat plate-shaped plate (20) comes in contact with the outer surface (11) of the dummy roller (10), it is possible to manufacture a roll stamp (30) in which the plate (20) having the pattern (22) formed thereon is disposed on the outer surface (11) of the dummy roller (10).

Here, in the first method of manufacturing a conventional roll stamp, in order to allow the flat plate-shaped plate (20) to maintain the cylindrical shape after the flat plate-shaped plate (20) is wound in the cylindrical shape, edge regions of the plate (20) should be joined. Therefore, a joining portion (24) illustrated in FIG. 3 is inevitably formed.

Meanwhile, in pressing the roll stamp (30) including the pattern (22) onto a predetermined plate material so that a shape corresponding to the pattern (22) is transferred onto the plate material, the pressing of the roll stamp (30) onto the predetermined plate material requires a very large pressure.

In the case in which a very large pressure is applied to the joining portion (24), the edge regions of the plate (20) are separated at the joining portion (24), and thus the roll stamp (30) is not able to perform its function.

Also, because it is difficult for patterns to be connected to have continuity at the joining portion (24) at which the edge regions of the plate (20) are joined, there is a disadvantage in that it is difficult to perform a patterning process continuously.

FIGS. 4 and 5 are schematic diagrams illustrating a second method of manufacturing a conventional roll stamp.

First, referring to FIG. 4, in the second method of manufacturing a conventional roll stamp, a cylindrical dummy roller (10) is provided. Here, the dummy roller (10) includes an outer surface (11).

Next, referring to FIG. 5, by directly forming a pattern (12) to be transferred on the outer surface (11) of the dummy roller (10) through direct patterning technology using a laser or the like, it is possible to manufacture a roll stamp (30') in which the pattern (12) is formed on the outer surface (11) of the dummy roller (10).

However, the direct patterning technology has a problem in that it is difficult to fabricate a roll stamp including fine patterns of tens of microns or less.

Therefore, despite being expected to have a productivity improvement effect, the roll stamp according to the related art is unable to be widely used due to difficulties in its fabrication.

DISCLOSURE OF INVENTION

Technical Problem

The present invention is directed to providing a method of manufacturing a roll stamp that, while allowing a roll stamp having fine patterns in micro-units to be manufactured, allows the fine patterns to be formed at a low cost without a seam throughout the entire area of the roll stamp.

The objectives of the present invention are not limited to that mentioned above, and other unmentioned objectives should be clearly understood by those of ordinary skill in the art from the following description.

Technical Solution

The present invention provides a roll stamp including: a cylindrical metal mold including a debossed pattern formed on an outer side and a hollow portion formed on an inner side; and a dummy roller inserted into the hollow portion.

The dummy roller may be inserted into the hollow portion by a shrink-fitting process.

A maximum value of reflectivity of the cylindrical metal mold may exceed 0 and be 5% or lower.

The maximum value of the reflectivity of the cylindrical metal mold may be in a range of 30° to 60°, which is a range of a measured angle θ2 of reflected lights R1 and R2 under a condition in which an angle of incidence θ1 of incident light E is 45° from a plane of a sample P.

The present invention provides a method of manufacturing a roll stamp, the method including: providing an object including a first embossed pattern; placing a first resin layer on an upper surface of the object including the first embossed pattern and pressing the first resin layer; manufacturing a first resin mold including a first debossed pattern by separating the first resin layer from the object; forming a first electroplating layer on an upper portion of the first resin mold including the first debossed pattern; manufacturing a first metal mold including a second embossed pattern by separating the first electroplating layer from the first resin mold; forming a second electroplating layer on an upper portion of the first metal mold including the second embossed pattern; manufacturing a second metal mold including a second debossed pattern by separating the second electroplating layer from the first metal mold; placing a second resin layer on an upper surface of the second metal mold including the second debossed pattern and pressing the second resin layer; manufacturing a second resin mold including a third embossed pattern by separating the second resin layer from the second metal mold; manufacturing a cylindrical resin mold by rolling the second resin mold so that the third embossed pattern is placed on an inner circumference side; forming a third electroplating layer having a cylindrical shape on an inner circumference of the cylindrical resin mold; manufacturing a cylindrical metal mold including a third debossed pattern formed on an outer side and a hollow portion formed on an inner side by separating the third electroplating layer having a cylindrical shape from the cylindrical resin mold; and inserting a dummy roller into the hollow portion of the cylindrical metal mold.

Each of the first resin mold and the second resin mold may be formed of thermoplastic resin such as polymethyl methacrylate (PMMA) or acrylate-based photocurable resin.

The first electroplating layer may be formed by performing an electroless plating method in which at least one or more of copper (Cu), nickel (Ni), silver (Ag), chromium (Cr), iron (Fe), and cobalt (Co) is plated, the second electroplating layer may be formed by performing an electroless plating method or an electroplating method in which at least one or more of Cu, Ni, Ag, Cr, Fe, and Co is plated, and the third electroplating layer may be formed by performing an electroless plating method in which at least one or more of Cu, Ni, Ag, Cr, Fe, and Co is plated.

The forming of the second electroplating layer on the upper portion of the first metal mold including the second embossed pattern may include forming a release layer on the upper portion of the first metal mold including the second embossed pattern and then forming the second electroplating layer on an upper portion of the release layer.

The release layer may be a chromate layer.

The inserting of the dummy roller into the hollow portion of the cylindrical metal mold may be performed by a shrink-fitting process.

The present invention provides a method of manufacturing a roll stamp, the method including: manufacturing a resin mold including an embossed pattern; manufacturing a cylindrical resin mold by rolling the resin mold so that the embossed pattern is placed on an inner circumference side; forming an electroplating layer having a cylindrical shape on an inner circumference of the cylindrical resin mold; manufacturing a cylindrical metal mold including a debossed pattern formed on an outer side and a hollow portion formed on an inner side by separating the electroplating layer having a cylindrical shape from the cylindrical resin mold; and inserting a dummy roller into the hollow portion of the cylindrical metal mold.

The present invention provides a method of manufacturing a roll stamp, the method including: providing an object including a first embossed pattern; placing a first resin layer on an upper surface of the object including the first embossed pattern and pressing the first resin layer; manufacturing a first resin mold including a first debossed pattern by separating the first resin layer from the object; forming a first electroplating layer on an upper portion of the first resin mold including the first debossed pattern; manufacturing a first metal mold including a second embossed pattern by separating the first electroplating layer from the first resin mold; forming a second electroplating layer on an upper portion of the first metal mold including the second embossed pattern; manufacturing a second metal mold including a second debossed pattern by separating the second electroplating layer from the first metal mold; placing a second resin layer on an upper surface of the second metal mold including the second debossed pattern and pressing the second resin layer; manufacturing a second resin mold including a third embossed pattern by separating the second resin layer from the second metal mold; manufacturing a cylindrical resin mold by rolling the second resin mold so that the third embossed pattern is placed on an inner circumference side; forming a third electroplating layer having a cylindrical shape on an inner circumference of the cylindrical resin mold; manufacturing a cylindrical metal mold including a third debossed pattern formed on an outer side and a hollow portion formed on an inner side by separating the third electroplating layer having a cylindrical shape from the cylindrical resin mold; arranging dies at a predetermined distance from the cylindrical metal mold; filling a space between the cylindrical metal mold and the dies with a filler; manufacturing a cylindrical filler mold including a fourth embossed pattern formed on an inner circumference and a hollow portion formed on an inner side by separating the dies and the cylindrical metal mold from the filler; filling the hollow portion of the cylindrical filler mold with a metal material; and separating the cylindrical filler mold from the filled metal material.

Each of the first resin mold and the second resin mold may be formed of thermoplastic resin such as polymethyl methacrylate (PMMA) or acrylate-based photocurable resin.

The first electroplating layer may be formed by performing an electroless plating method in which at least one or more of copper (Cu), nickel (Ni), silver (Ag), chromium (Cr), iron (Fe), and cobalt (Co) is plated, the second electroplating layer may be formed by performing an electroless plating method or an electroplating method in which at least one or more of Cu, Ni, Ag, Cr, Fe, and Co is plated, and the third electroplating layer may be formed by performing an electroless plating method in which at least one or more of Cu, Ni, Ag, Cr, Fe, and Co is plated.

The forming of the second electroplating layer on the upper portion of the first metal mold including the second embossed pattern may include forming a release layer on the upper portion of the first metal mold including the second embossed pattern and then forming the second electroplating layer on an upper portion of the release layer.

The release layer may be a chromate layer.

The present invention provides a method of manufacturing a roll stamp, the method including: manufacturing a cylindrical metal mold including a first debossed pattern formed on an outer side and a first hollow portion formed on an inner side; arranging dies at a predetermined distance from the cylindrical metal mold; filling a space between the cylindrical metal mold and the dies with a filler; manufacturing a cylindrical filler mold including a first embossed pattern formed on an inner circumference and a second hollow portion formed on an inner side by separating the dies and the cylindrical metal mold from the filler; filling the second hollow portion of the cylindrical filler mold with a metal material; and separating the cylindrical filler mold from the filled metal material.

The manufacturing of the cylindrical metal mold including the first debossed pattern formed on the outer side and the first hollow portion formed on the inner side may include: manufacturing a resin mold including a second embossed pattern; manufacturing a cylindrical resin mold by rolling the resin mold so that the second embossed pattern is placed on an inner circumference side; forming an electroplating layer having a cylindrical shape on an inner circumference of the cylindrical resin mold; and manufacturing the cylindrical metal mold by separating the electroplating layer having a cylindrical shape from the cylindrical resin mold.

The present invention provides a roll stamp including a debossed pattern formed at an outer circumference, wherein a maximum value of reflectivity of the roll stamp exceeds 0 and is 5% or lower.

The maximum value of the reflectivity of the roll stamp may be in a range of 30° to 60°, which is a range of a measured angle θ2 of reflected lights R1 and R2 under a condition in which an angle of incidence θ1 of incident light E is 45° from a plane of a sample P.

Advantageous Effects of Invention

According to the present invention, a cylindrical metal mold including a third debossed pattern formed on an outer side and a hollow portion formed on an inner side is manufactured, and then a dummy roller is inserted into the hollow portion so that a roll stamp is manufactured. Therefore, because a joining portion is not formed on the entire area of the cylindrical metal mold, a problem in which edge regions are separated does not occur. Also, due to the absence of the joining portion, it is possible to perform a patterning process continuously.

In addition, in the present invention, both an imprinting process and an electroplating process, which are used in the process of manufacturing the cylindrical metal mold, correspond to a technology capable of implementing fine patterns in micro-units. Therefore, the third debossed pattern formed on the outer side of the cylindrical metal mold may also be implemented as a fine pattern in micro-units, and thus, a predetermined pattern of a target product that is formed by the third debossed pattern may also be duplicated as a fine pattern in micro-units.

BRIEF DESCRIPTION OF DRAWINGS

FIG. 25 is an actual image showing a state in which a pattern is formed using an electroplating method according to the present invention.

FIG. 26 shows actual images for comparing a state of silk fabric and a state in which a pattern is transferred onto a target product using the roll stamp according to the present invention.

BEST MODE OF THE INVENTION

Figure 1:
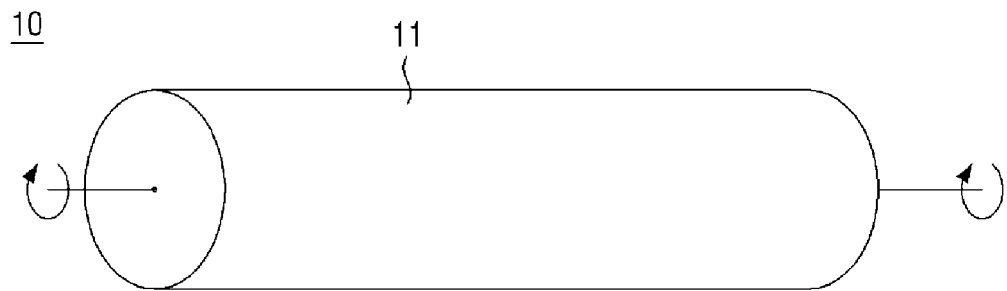
FIGS. 1 to 3 are schematic diagrams illustrating a first method of manufacturing a conventional roll stamp.

Advantages and features of the present invention and a method of achieving the same should become clear with embodiments described in detail below with reference to the accompanying drawings. However, the present invention is not limited to embodiments disclosed below and is realized in various other forms. The present embodiments make the disclosure of the present invention complete and are provided to completely inform those of ordinary skill in the art to which the present invention pertains of the scope of the invention. The present invention is defined only by the scope of the claims.

Details for practicing the present invention will be described below with reference to the accompanying drawings. Like reference numerals refer to the same elements regardless of the drawings. The term "and/or" includes each mentioned item and all combinations of one or more of the items.

Ordinals such as first and second may be used to describe various elements, but of course the elements are not limited by the terms. The terms are only used for the purpose of distinguishing one element from another element. Therefore, a first element mentioned below may also be a second element within the technical idea of the present invention.

Terms used herein are for describing the embodiments and are not intended to limit the present invention. In the specification, a singular expression includes a plural expression unless the context clearly indicates otherwise. The terms "comprises" and/or "comprising" used herein do not preclude the existence of or the possibility of adding one or more elements other than those mentioned.

Unless otherwise defined, all terms including technical and scientific terms used herein have the same meaning as commonly understood by one of ordinary skill in the art to which the present invention pertains. Terms, such as those defined in commonly used dictionaries, are not to be construed in an idealized or overly formal sense unless expressly so defined herein.

Spatially relative terms such as "below," "beneath," "lower," "above" and "upper" may be used to facilitate description of the relationship between one element and another element illustrated in the drawings. Such spatially relative terms should be understood as terms encompassing different orientations of elements in use or operation in addition to the orientations depicted in the drawings. For example, when the elements illustrated in the drawings are flipped upside down, certain elements which are described as being "below" or "beneath" other elements may be placed "above" the other elements. Therefore, "below," which is an illustrative term, may encompass both downward and upward directions. The elements may also be oriented in other directions. Accordingly, the spatially relative terms may be interpreted according to orientations.

Hereinafter, exemplary embodiments of the present invention will be described in detail with reference to the accompanying drawings.

Figure 6:
FIGS. 6 to 18 are schematic diagrams for describing a method of manufacturing a roll stamp for an imprint apparatus according to a first embodiment.
Figure 18:
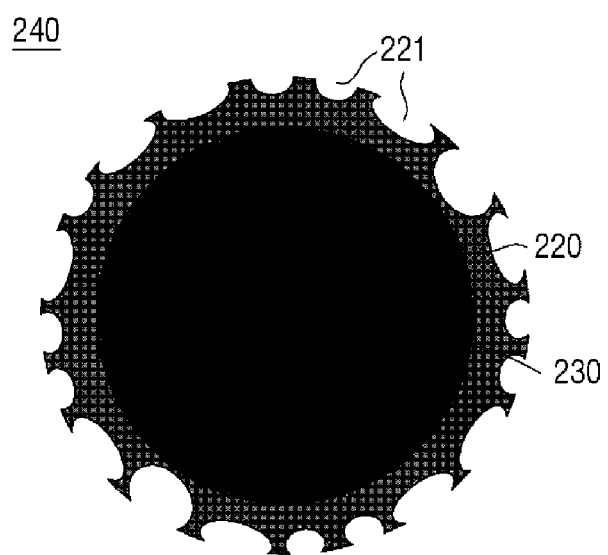
Figure 19:
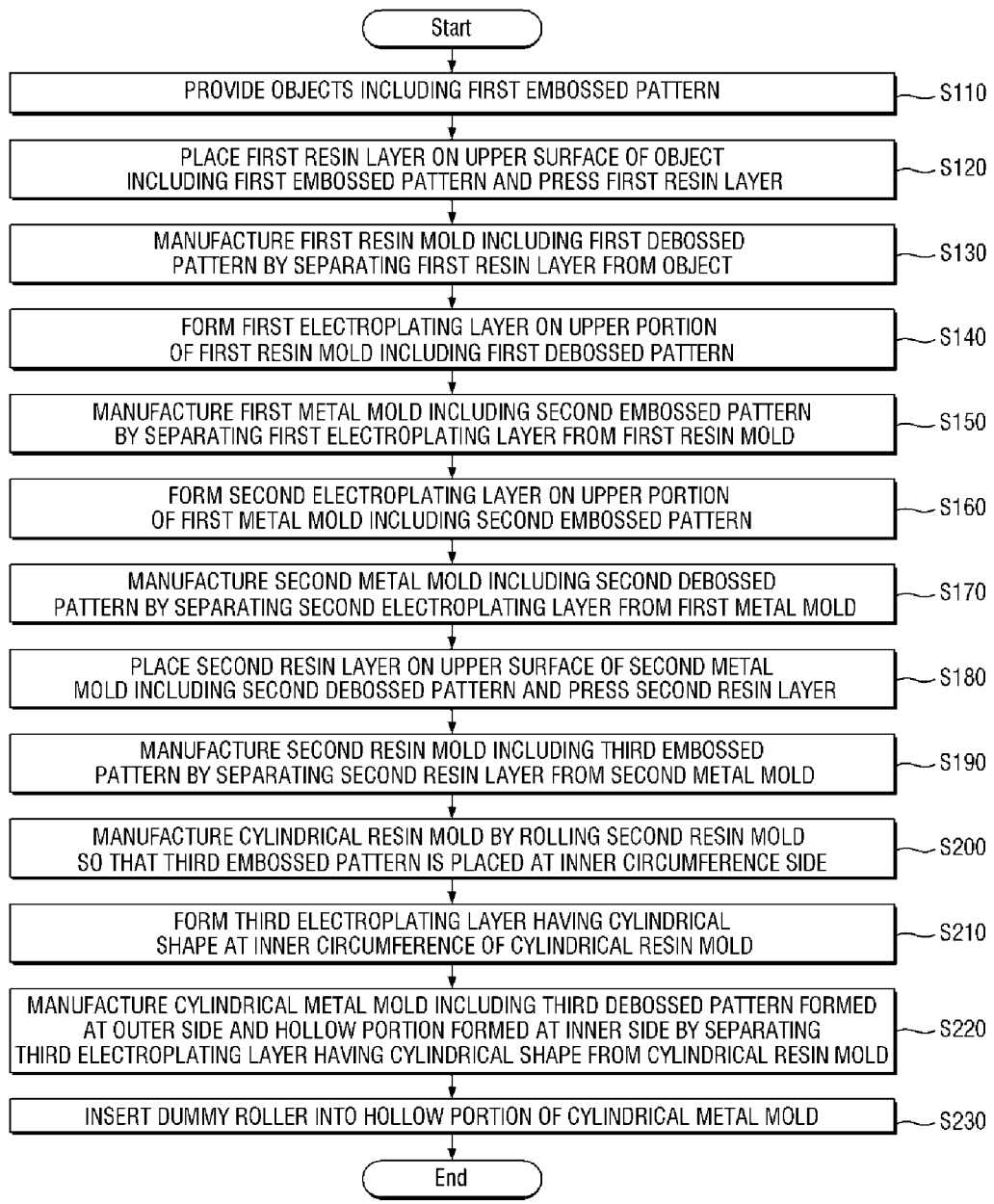
FIG. 19 is a flowchart for describing the method of manufacturing the roll stamp for an imprint apparatus according to the first embodiment.

FIGS. 6 to 18 are schematic diagrams for describing a method of manufacturing a roll stamp for an imprint apparatus according to a first embodiment, and FIG. 19 is a flowchart for describing the method of manufacturing the roll stamp for an imprint apparatus according to the first embodiment First, referring to FIGS. 6 and 19, the method of manufacturing the roll stamp for an imprint apparatus according to the first embodiment includes providing an object 110 including a first embossed pattern 111 (S110).

Here, the object 110 may be a natural object in a natural state such as natural fiber, natural leather, wood, and leaves, and the first embossed pattern 111 may be a natural pattern which is included in the natural object.

That is, in the first embodiment, a natural pattern which is included in a natural object in a natural state may be duplicated on a surface of metal, a film, an injection-molded product, or the like, which will be described below.

Figure 7:
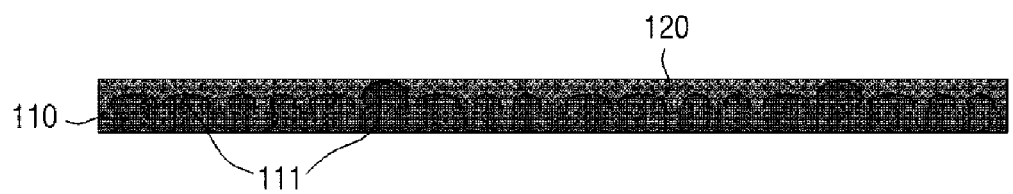

Next, referring to FIGS. 7 and 19, the method of manufacturing the roll stamp for an imprint apparatus according to the first embodiment includes placing a first resin layer 120 on an upper surface of the object 110 including the first embossed pattern 111 and pressing the first resin layer (S120).

This corresponds to a general imprinting process. Because the imprinting process is self-evident to those of ordinary skill in the art, detailed description thereof will be omitted.

Thermoplastic resin such as polymethyl methacrylate (PMMA) or acrylate-based photocurable resin may be used as a material of the first resin layer 120, but the material of the first resin layer 120 is not limited thereto in the first embodiment.

Figure 8:
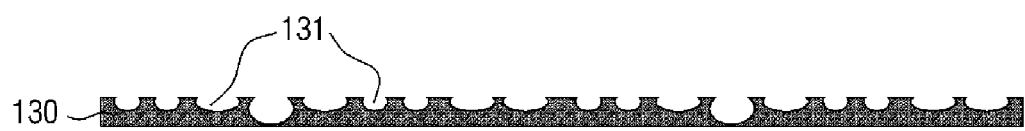

Next, referring to FIGS. 8 and 19, the method of manufacturing the roll stamp for an imprint apparatus according to the first embodiment includes manufacturing a first resin mold 130 including a first debossed pattern 131 by separating the first resin layer 120 from the object 110 (S130).

Here, the first resin layer 120 may be thermally cured or photocured before the first resin layer 120 is separated from the object 110, or, conversely, the first resin layer 120 may be thermally cured or photocured after the first resin layer 120 is separated from the object 110.

Meanwhile, the first debossed pattern 131 is formed to correspond to the first embossed pattern 111.

By applying pressure to the first resin layer 120 in Step S120, a partial region of the first resin layer 120 is deformed into a debossed shape corresponding to the first embossed pattern 111. In this way, the first debossed pattern 131 is formed to correspond to the first embossed pattern 111.

Figure 9:

Next, referring to FIGS. 9 and 19, the method of manufacturing the roll stamp for an imprint apparatus according to the first embodiment includes forming a first electroplating layer 140 on an upper portion of the first resin mold 130 including the first debossed pattern 131 (S140).

The first electroplating layer 140 may be formed by performing an electroless plating method in which at least one or more of copper (Cu), nickel (Ni), silver (Ag), chromium (Cr), iron (Fe), and cobalt (Co) is plated.

The electroless plating method is a plating method using a chemical reaction by an autocatalysis. Unlike in electroplating, a film is formed even when electricity does not pass through an object to be plated. A film may be formed on almost all materials such as plastic, paper, fiber, and ceramics, in addition to metal.

A film may also be formed on a material of a complex structure. The formed film has excellent physical properties in terms of corrosion resistance, alkali resistance, abrasion resistance, solderability, adhesiveness, heat resistance, and the like. Thus, the film is widely applied to automobiles, aircraft, general machinery, electronic parts, and chemical plants.

Because the electroless plating method is self-evident to those of ordinary skill in the art, detailed description thereof will be omitted. However, the method of forming the first electroplating layer and the material of the plating layer are not limited to the above in the first embodiment.

Figure 10:

Next, referring to FIGS. 10 and 19, the method of manufacturing the roll stamp for an imprint apparatus according to the first embodiment includes manufacturing a first metal mold 150 including a second embossed pattern 151 by separating the first electroplating layer 140 from the first resin mold 130 (S150).

Here, the separating of the first electroplating layer 140 from the first resin mold 130 may be performed well due to releasability according to the materials of the first resin mold 130 and the first electroplating layer 140.

Meanwhile, the second embossed pattern 151 is formed to correspond to the first debossed pattern 131.

Because the electroless plating method in Step S130 allows even a material of a complex structure to be plated well, the second embossed pattern 151 may be easily formed along a surface of the first debossed pattern 131. Accordingly, the second embossed pattern 151 is formed to correspond to the first debossed pattern 131.

Here, because the second embossed pattern 151 is formed to correspond to the first debossed pattern 131 and the first debossed pattern 131 is formed to correspond to the first embossed pattern 111, the second embossed pattern 151 is formed in the same shape as the first embossed pattern 111.

That is, the first embossed pattern 111 which is included in the object 110 is duplicated as the second embossed pattern 151 of the first metal mold 150. Accordingly, when the object is a natural object in a natural state, the second embossed pattern 151 may be a natural pattern which is included in the natural object.

Figure 11:

Next, referring to FIGS. 11 and 19, the method of manufacturing the roll stamp for an imprint apparatus according to the first embodiment includes forming a second electroplating layer 160 on an upper portion of the first metal mold 150 including the second embossed pattern 151 (S160).

The second electroplating layer 160 may be formed by performing an electroless plating method or an electroplating method in which at least one or more of Cu, Ni, Ag, Cr, Fe, and Co is plated.

Because the electroless plating method or electroplating method for forming the plating layer is self-evident to those of ordinary skill in the art, detailed description thereof will be omitted. However, the method of forming the second electroplating layer and the material of the plating layer are not limited to the above in the first embodiment.

Figure 12:

Next, referring to FIGS. 12 and 19, the method of manufacturing the roll stamp for an imprint apparatus according to the first embodiment includes manufacturing a second metal mold 170 including a second debossed pattern 171 by separating the second electroplating layer 160 from the first metal mold 150 (S170).

Meanwhile, in order to facilitate the separating of the second electroplating layer 160 from the first metal mold 150, preferably, a release layer (not illustrated) is included between the first metal mold 150 and the second electroplating layer 160.

Here, the release layer (not illustrated) may be a chromate layer.

The chromate layer will be described in more detail. For example, Fe is corroded due to salt, moisture in the atmosphere, or ions. Because corrosion of an oxide layer of Fe progresses continuously unlike corrosion of an oxide layer of Cr, aluminum, or the like, depth corrosion occurs.

In order to address this, a method of suppressing corrosion by plating or coating a surface with zinc (Zn) or zinc alloy (Zn alloy) has been commonly used. A metal plated with Zn or Zn alloy is widely used as a rust-prevention metal for automobiles, home appliances, construction materials, and the like that require corrosion resistance.

However, pure Zn has a drawback in that corrosion of Zn plating itself progresses very rapidly in a corrosive environment in which salt spray or the like occurs. Also, pure Zn is prone to generate conductive zinc oxide (ZnO) as the product of corrosion, and a decrease in a surface protection effect due to the product of corrosion being present on the surface also acts as a factor that reduces corrosion resistance.

Therefore, as a method of suppressing the corrosion of Zn, it is common to perform chromate treatment in which a Zn film or a Zn alloy film is coated with Cr.

The chromate process for forming a chromate layer is a process corresponding to the final treatment after performing a Zn plating process. Generally, a chromate solution for performing the chromate treatment may be made using a mixture of hexavalent chromic anhydride, sodium bichromate, and acid. The chromate layer may also be formed by trivalent chromate using trivalent Cr.

Through the known method of forming a chromate layer, the release layer (not illustrated) may be formed between the first metal mold 150 and the second electroplating layer 160. For example, the release layer (not illustrated) may be formed at the upper portion of the first metal mold 150 including the second embossed pattern 151, and then the second electroplating layer 160 may be formed at an upper portion of the release layer.

As described above, because the release layer (not illustrated) has high releasability, the separating of the second electroplating layer 160 from the first metal mold 150 may be easily performed.

Also, because the release layer of the chromate layer has conductivity, the chromate layer may serve as an electrode in a plating process for forming the second electroplating layer.

That is, the chromate layer is a material having electrical conductivity and may add high releasability between the first metal mold 150 and the second electroplating layer 160.

Figure 13:

Next, referring to FIGS. 13 and 19, the method of manufacturing the roll stamp for an imprint apparatus according to the first embodiment includes placing a second resin layer 180 on an upper surface of the second metal mold 170 including the second debossed pattern 171 and pressing the second resin layer (S180).

This corresponds to a general imprinting process. Because the imprinting process is self-evident to those of ordinary skill in the art, detailed description thereof will be omitted.

Thermoplastic resin such as PMMA or acrylate-based photocurable resin may be used as a material of the second resin layer 180, but the material of the second resin layer 180 is not limited thereto in the first embodiment.

Figure 14:

Next, referring to FIGS. 14 and 19, the method of manufacturing the roll stamp for an imprint apparatus according to the first embodiment includes manufacturing a second resin mold 190 including a third embossed pattern 191 by separating the second resin layer 180 from the second metal mold 170 (S190).

Here, the second resin layer 180 may be thermally cured or photocured before the second resin layer 180 is separated from the second metal mold 170, or, conversely, the second resin layer 180 may be thermally cured or photocured after the second resin layer 180 is separated from the second metal mold 170.

Meanwhile, the third embossed pattern 191 is formed to correspond to the second debossed pattern 171.

By applying pressure to the second resin layer 180 in Step S180, a partial region of the second resin layer 180 is deformed into an embossed shape corresponding to the second debossed pattern 171. In this way, the third embossed pattern 191 is formed to correspond to the second debossed pattern 171.

Meanwhile, the third embossed pattern 191 is formed in the same shape as the first embossed pattern 111.

That is, the first embossed pattern 111 which is included in the object 110 is duplicated as the third embossed pattern 191 of the second resin mold 190. Accordingly, when the object is a natural object in a natural state, the third embossed pattern 191 may be a natural pattern which is included in the natural object.

Figure 15:
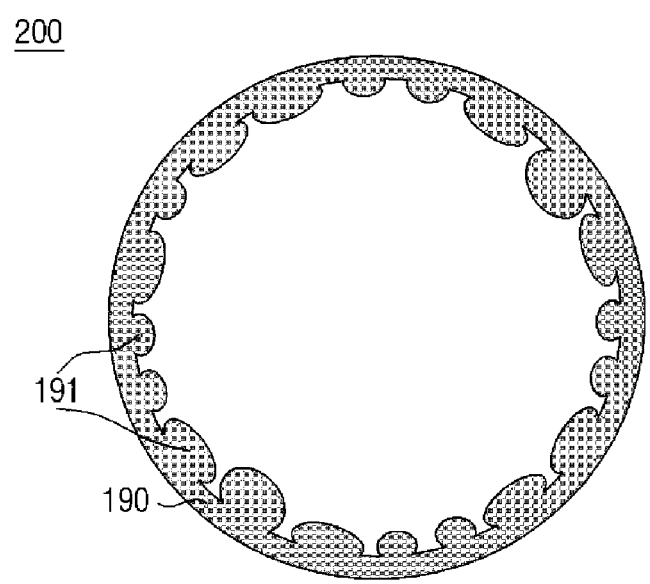

Next, referring to FIGS. 15 and 19, the method of manufacturing the roll stamp for an imprint apparatus according to the first embodiment includes manufacturing a cylindrical resin mold 200 by rolling the second resin mold 190 so that the third embossed pattern 191 is placed on an inner circumference side (S200).

Due to being formed of thermoplastic resin such as PMMA or acrylate-based photocurable resin, the second resin mold 190 may be easily rolled into a cylindrical shape. Also, edge regions of the second resin mold 190 may be easily joined using a known adhesive material.

Here, as mentioned above, the third embossed pattern 191 should be placed on an inner circumference side of the cylindrical resin mold 200.

Figure 16:
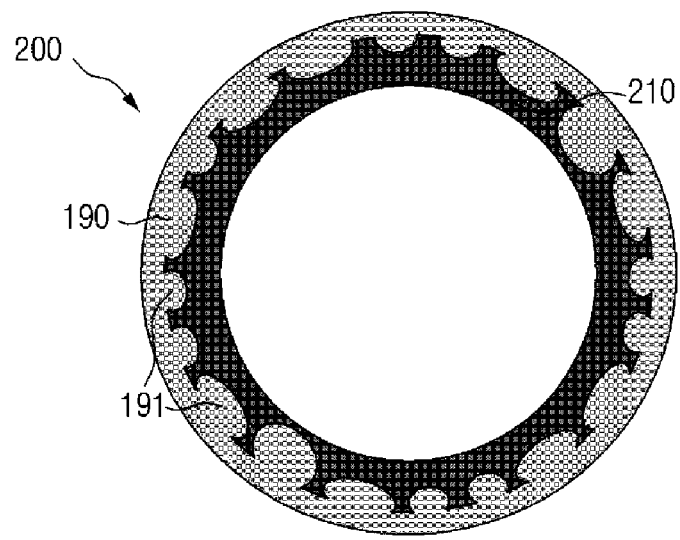

Next, referring to FIGS. 16 and 19, the method of manufacturing the roll stamp for an imprint apparatus according to the first embodiment includes forming a third electroplating layer 210 having a cylindrical shape on an inner circumference of the cylindrical resin mold 200 (S210).

The third electroplating layer 210 may be formed by performing an electroless plating method in which at least one or more of Cu, Ni, Ag, Cr, Fe, and Co is plated.

Because the electroless plating method is self-evident to those of ordinary skill in the art, detailed description thereof will be omitted. However, the method of forming the third electroplating layer and the material of the plating layer are not limited to the above in the first embodiment.

Figure 17:
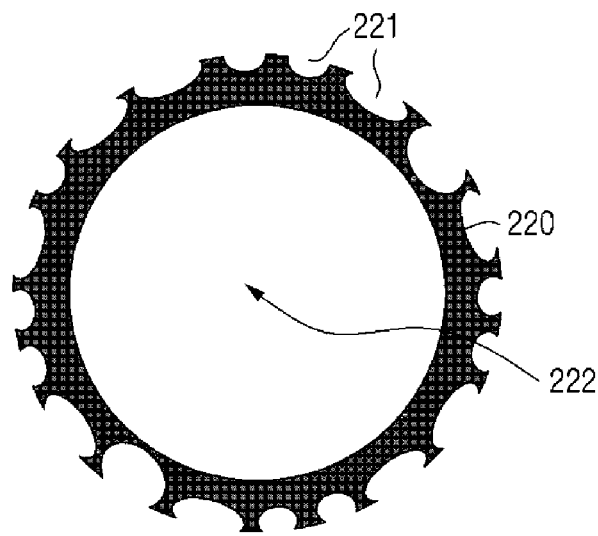

Next, referring to FIGS. 17 and 19, the method of manufacturing the roll stamp for an imprint apparatus according to the first embodiment includes manufacturing a cylindrical metal mold 220 including a third debossed pattern 221 formed on an outer side and a hollow portion 222 formed on an inner side by separating the third electroplating layer 210 having a cylindrical shape from the cylindrical resin mold 200 (S220).

Here, the separating of the third electroplating layer 210 having a cylindrical shape from the cylindrical resin mold 200 may be performed well due to releasability according to the materials of the cylindrical resin mold 200 and the third electroplating layer 210.

Meanwhile, the third debossed pattern 221 is formed to correspond to the third embossed pattern 191.

Because the electroless plating method in Step S210 allows even a material of a complex structure to be plated well, the third debossed pattern 221 may be easily formed along a surface of the third embossed pattern 191. Accordingly, the third debossed pattern 221 is formed to correspond to the third embossed pattern 191.

Here, because the third embossed pattern 191 is formed in the same shape as the first embossed pattern 111, accordingly, the third debossed pattern 221 is formed to correspond to the first embossed pattern 111.

Next, referring to FIGS. 18 and 19, the method of manufacturing the roll stamp for an imprint apparatus according to the first embodiment includes inserting a dummy roller 230 into the hollow portion 222 of the cylindrical metal mold 220 (S230).

Figure 2:
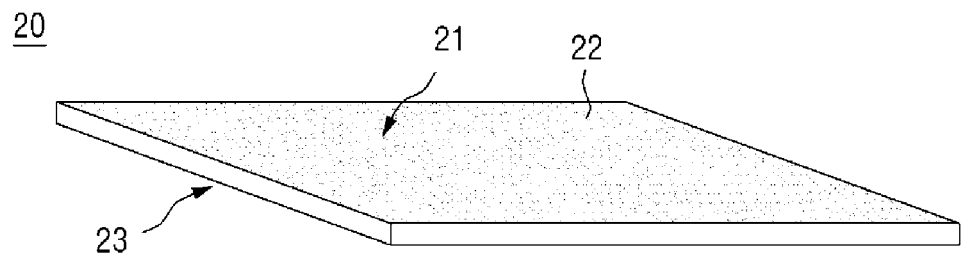

The dummy roller 230 has the same configuration as the dummy roller mentioned above with reference to FIGS. 1 and 2.

The inserting of the dummy roller 230 into the hollow portion 222 of the cylindrical metal mold 220 may be performed by a shrink-fitting process. For example, Korean Patent Publication No. 10-2015-0096535 may be referenced for details of the known shrink-fitting process.

However, the method of inserting the dummy roller 230 into the hollow portion 222 of the cylindrical metal mold 220 is not limited thereto in the first embodiment.

Using the method described above with reference to FIGS. 6 to 19, a roll stamp 240 according to the first embodiment may be manufactured as illustrated in FIG. 18.

That is, the roll stamp 240 according to the first embodiment includes: the cylindrical metal mold 220 including the third debossed pattern 221 formed on the outer side and the hollow portion 222 formed on the inner side; and the dummy roller 230 inserted into the hollow portion 222.

Here, although not illustrated, a shaft (not illustrated) may be installed at the center of the dummy roller 230, and, by rotating the shaft, the dummy roller 230 and the cylindrical metal mold 220 may rotate.

Figure 20:
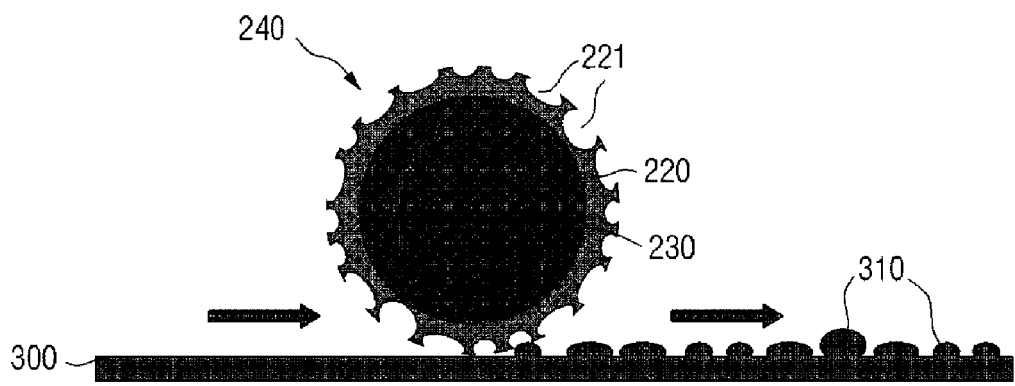
FIG. 20 is a schematic diagram illustrating transferring of patterns using the roll stamp according to the first embodiment.
Figure 21:
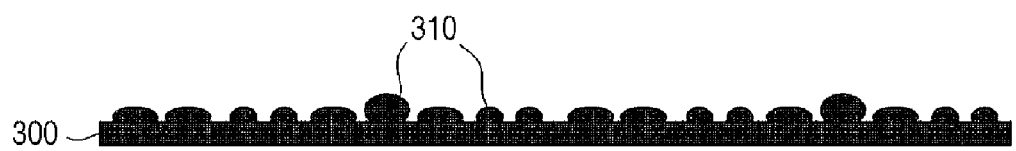
FIG. 21 is a view illustrating a product onto which a pattern is transferred using the roll stamp according to the first embodiment.

FIG. 20 is a schematic diagram illustrating transferring of patterns using the roll stamp according to the first embodiment, and FIG. 21 is a view illustrating a product onto which a pattern is transferred using the roll stamp according to the first embodiment.

First, referring to FIG. 20, a shaft (not illustrated) may be installed at the center of the dummy roller 230 in the roll stamp 240 according to the first embodiment, and, by rotating the shaft, the dummy roller 230 and the cylindrical metal mold 220 may rotate.

Here, a target product 300 onto which a pattern will be transferred is placed below the roll stamp 240, and, when the target product 300 moves along with rotation of the roll stamp 240, a predetermined pattern 310 is formed on a surface of the target product 300.

Meanwhile, the target product 300 may be metal, a film, an injection-molded product, or the like, but the kinds of target products onto which a pattern will be transferred are not limited thereto in the first embodiment.

That is, due to pressing of the roll stamp 240, the predetermined pattern 310 is formed in a shape corresponding to the third debossed pattern 221 placed on the outer side of the cylindrical metal mold 220.

Here, as described above, because the third embossed pattern 191 is formed in the same shape as the first embossed pattern 111, accordingly, the third debossed pattern 221 is formed to correspond to the first embossed pattern 111.

For this reason, the predetermined pattern 310 formed in the shape corresponding to the third debossed pattern 221 is formed in the same shape as the first embossed pattern 111.

That is, as illustrated in FIG. 21, the first embossed pattern 111 which is included in the object 110 is duplicated as the predetermined pattern 310 of the target product 300. Accordingly, when the object is a natural object in a natural state, the predetermined pattern 310 may be a natural pattern which is included in the natural object.

Therefore, in the first embodiment, a natural pattern which is included in a natural object in a natural state may be duplicated on a surface of a target product such as metal, a film, or an injection-molded product.

Figure 3:
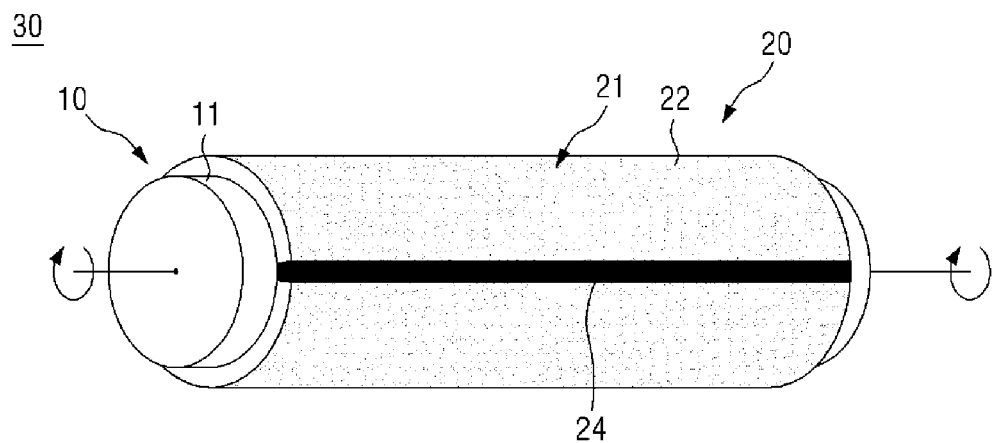

Meanwhile, as described above, referring to FIGS. 1 to 3, the first method of manufacturing a conventional roll stamp has disadvantages in that, because the edge regions of the plate 20 are separated at the joining portion 24, the roll stamp 30 is not able to perform its function, and, because it is difficult for patterns to be connected to have continuity at the joining portion 24, it is difficult to perform a patterning process continuously.

Figure 4:
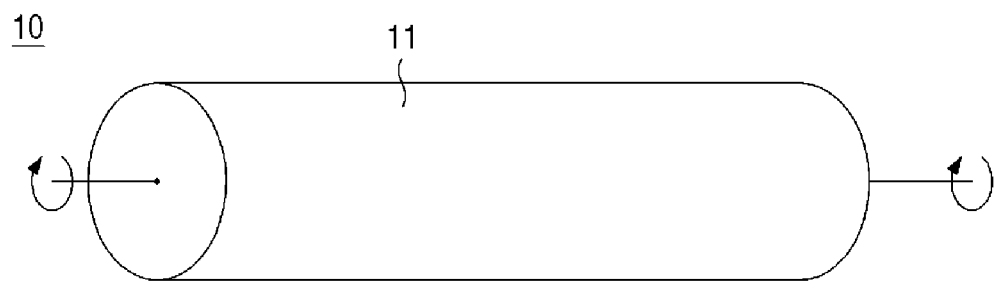
FIGS. 4 and 5 are schematic diagrams illustrating a second method of manufacturing a conventional roll stamp.
Figure 5:
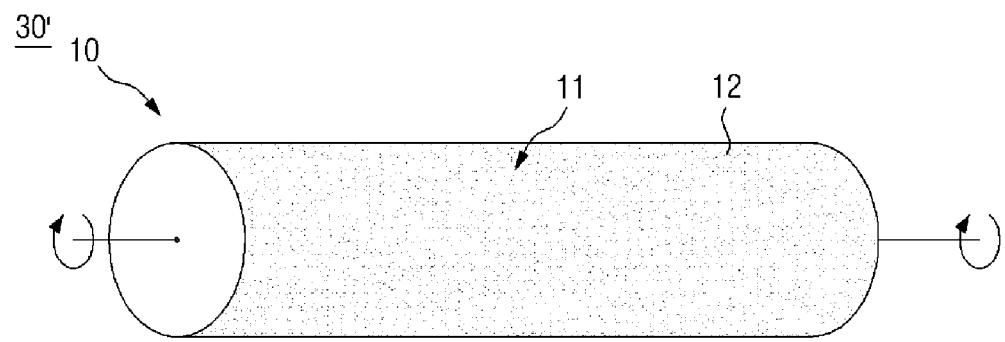

Also, referring to FIGS. 4 and 5, the second method of manufacturing a conventional roll stamp, i.e. directly forming the pattern 12 to be transferred on the outer surface of the dummy roller 10 through direct patterning technology using a laser or the like, has a problem in that it is difficult to implement fine patterns of tens of microns or less using the direct patterning technology.

However, in the first embodiment, by the process described above, the cylindrical metal mold 220 including the third debossed pattern 221 formed on the outer side and the hollow portion 222 formed on the inner side is manufactured and then the dummy roller 230 is inserted into the hollow portion 222 so that the roll stamp is manufactured. Thus, because a joining portion (seam) is not formed on the entire area of the cylindrical metal mold 220, a problem in which edge regions are separated does not occur. Also, due to the absence of the joining portion, it is possible to perform a patterning process continuously.

Also, in the first embodiment, both the imprinting process and the electroplating process, which are used in the process of manufacturing the cylindrical metal mold 220, correspond to a technology capable of implementing fine patterns in micro-units. Therefore, the third debossed pattern 221 formed on the outer side of the cylindrical metal mold 220 may also be implemented as a fine pattern in micro-units, and thus, the predetermined pattern 310 of the target product 300 that is formed by the third debossed pattern 221 may also be duplicated as a fine pattern in micro-units.

Figure 22:
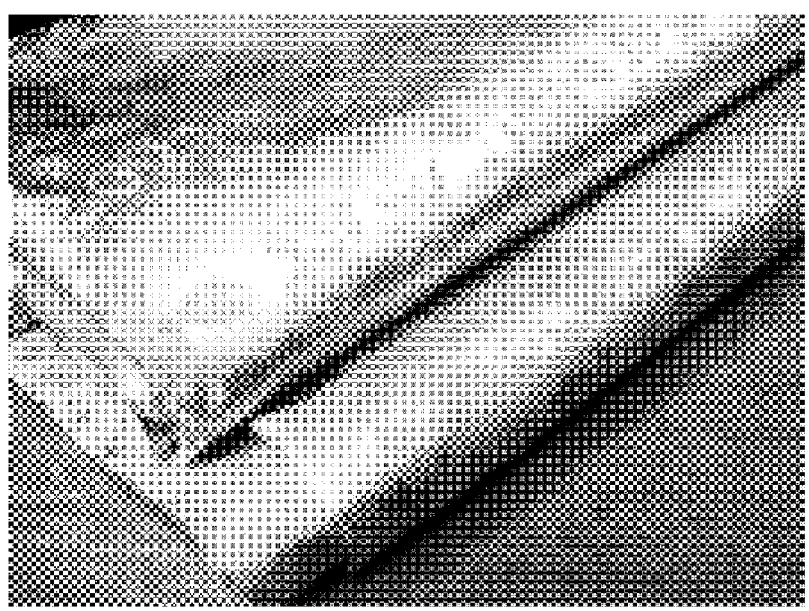
FIGS. 22 and 23 are actual images showing examples of an object according to the present invention.
Figure 23:
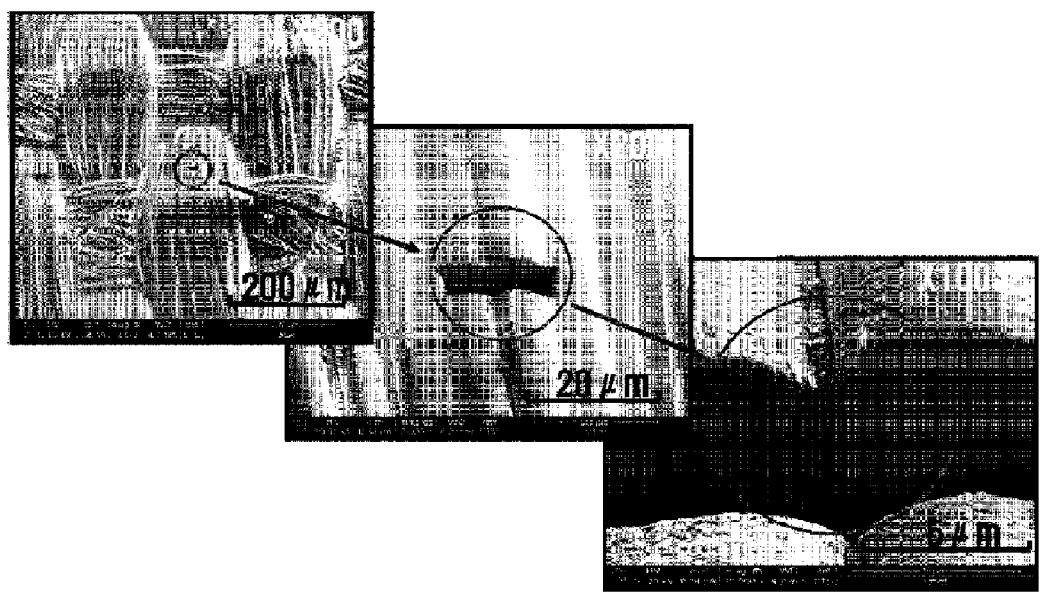

FIGS. 22 and 23 are actual images showing examples of an object according to the present invention.

Referring to FIGS. 22 and 23, silk fabric is shown as the object. As illustrated in FIG. 23, the silk fabric includes various natural patterns of micro-sizes. The natural pattern may be expressed as the first embossed pattern described above with reference to FIG. 6.

The silk fabric corresponds to a natural material that is woven into cloth of tens to hundreds of centimeters in size by twisting silk strands horizontally and vertically, wherein each silk strand includes fine nano-protrusions of hundreds of nanometers in size and patterns of tens to hundreds of micrometers in size.

That is, the silk fabric is a natural material of a multi-scale structure that includes all of a nanostructure, a microstructure, and a bulk structure. So far, there has been no method to implement such a multi-scale structure.

Figure 24:
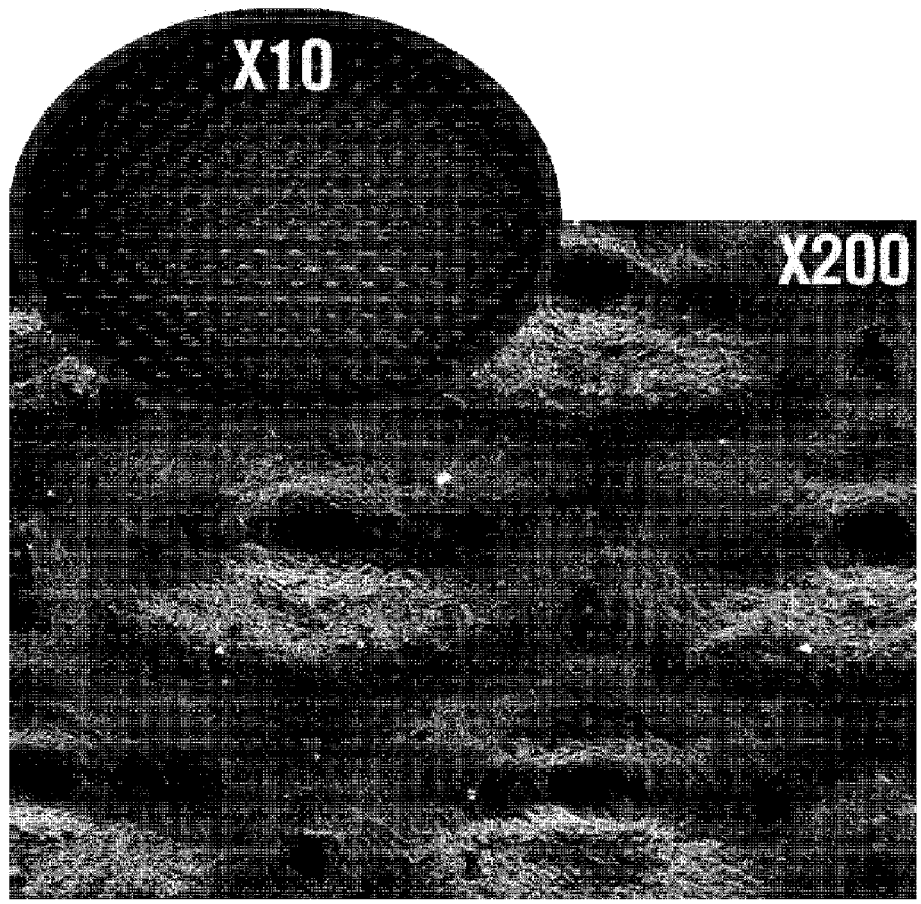
FIG. 24 is an actual image showing a state in which a pattern is formed by machining.

FIG. 24 is an actual image showing a state in which a pattern is formed by machining, and FIG. 25 is an actual image showing a state in which a pattern is formed using an electroplating method according to the present invention.

Comparing FIGS. 24 and 25, the state in which the pattern is formed by machining and the state in which the pattern is formed using the electroplating method according to the present invention are not clearly distinguished at a magnification of 10 times, but differences therebetween are clearly visible at a magnification of 200 times.

That is, in order to implement texture of a silk material as described above on a metal material after forming a pattern by machining, mechanically, a high-durability, ultra-precision tip capable of processing in hundreds of nanometers and tens to hundreds of micrometers is required, and, three-dimensionally, a task of finding an exact position and performing processing repeatedly is required. This corresponds to a technology that is not economically or technically possible.

However, in the present invention, as illustrated in FIG. 25, both the imprinting process and the electroplating process used in the process of manufacturing the cylindrical metal mold correspond to a technology capable of implementing fine patterns in micro-units. Thus, the third debossed pattern formed on the outer side of the cylindrical metal mold may also be implemented as a fine pattern in micro-units.

FIG. 26 shows actual images for comparing a state of silk fabric and a state in which a pattern is transferred onto a target product using the roll stamp according to the present invention.

Referring to FIG. 26, from the comparison between a 300 times magnification of a silk fabric (master) and a 300 times magnification of a state (metal plate material) in which the pattern of the silk fabric is duplicated on a target product using the roll stamp according to the present invention, it can be seen that the pattern of the silk fabric is almost perfectly reproduced on the target product.

Figure 27:
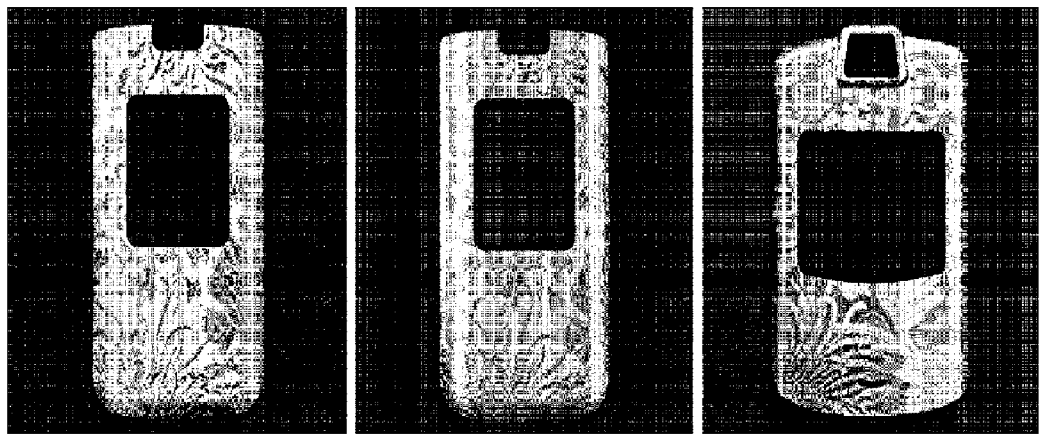
FIG. 27 shows actual images of a state in which a pattern is transferred onto a target product.

FIG. 27 shows actual images of a state in which a pattern is transferred onto a target product.

Referring to FIG. 27, the target product is a mobile phone case. FIG. 27 shows a state in which the pattern of the silk fabric is transferred onto a metal case formed of aluminum.

However, in the present invention, the target product may be metal, a film, an injection-molded product, or the like. In the present invention, the kinds of target products onto which a pattern will be transferred are not limited thereto.

As more specific application examples, the present invention may be applied to interior and exterior materials of home appliances such as a mobile phone, a laptop, an MP3 player, a camera, a refrigerator, and an air conditioner, interior and exterior materials of buildings such as an elevator, a fire door, and wallpaper, and interior and exterior materials of transportation equipment such as an aircraft, a cruise ship, and a yacht. The present invention may also be applied to lids of various cosmetic containers, various beverage containers, and the like.

Figure 28:
FIG. 28 is an actual image showing an example of a cylindrical metal mold according to the present invention.
Figure 29:
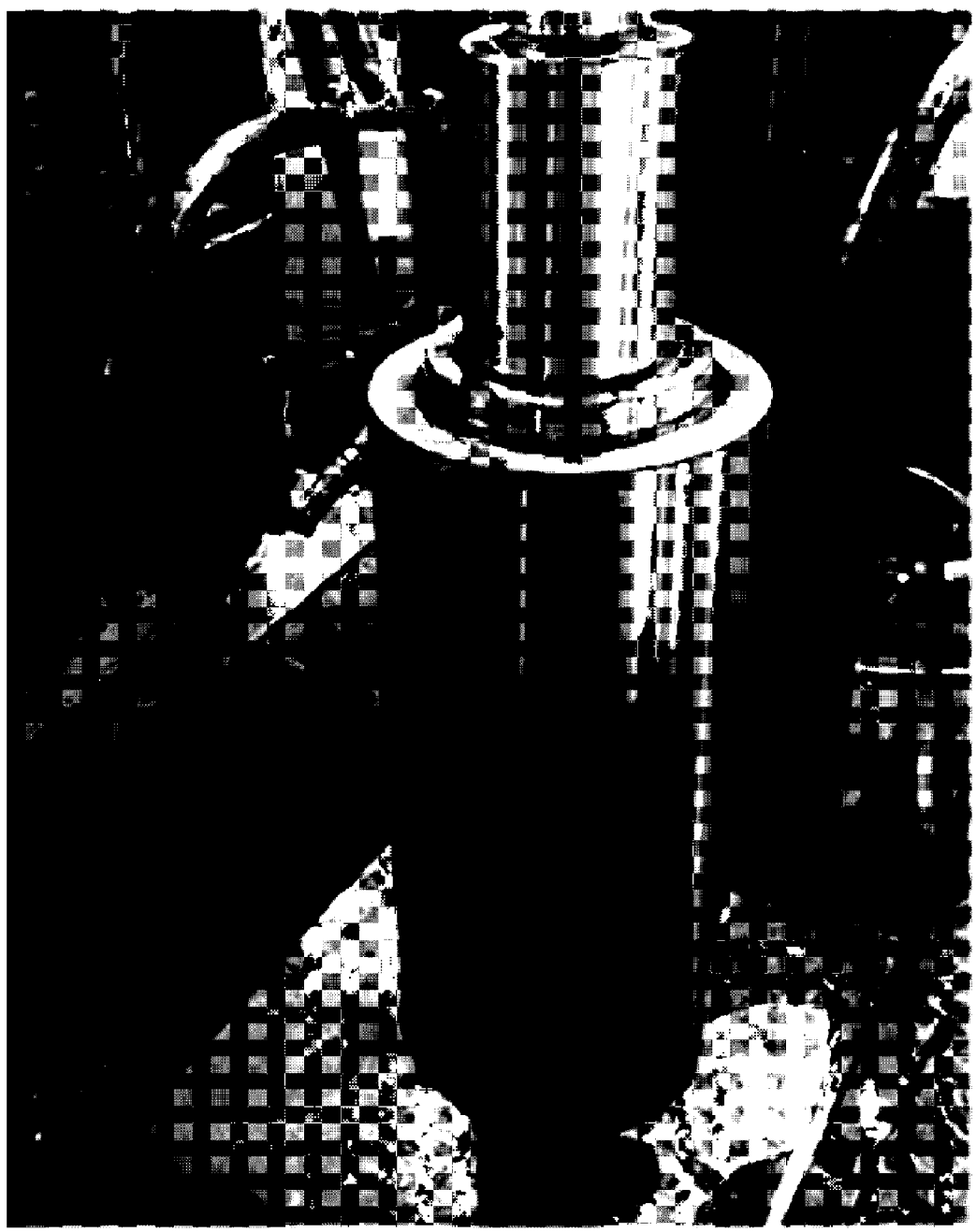
FIG. 29 is an actual image showing a dummy roller according to the present invention.
Figure 30:
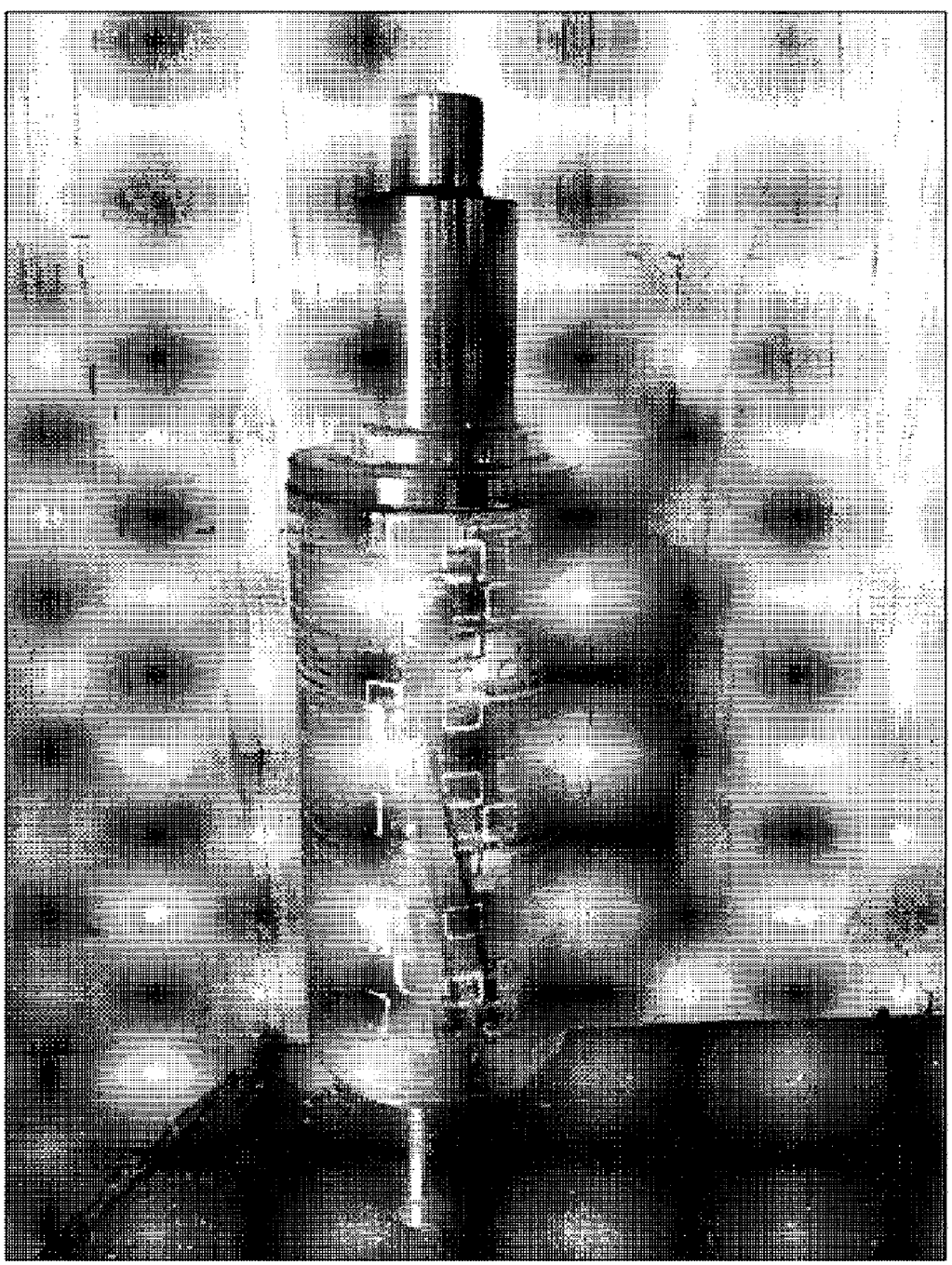
FIG. 30 is an actual image showing a process of shrink-fitting the dummy roller into the cylindrical metal mold.
Figure 31:
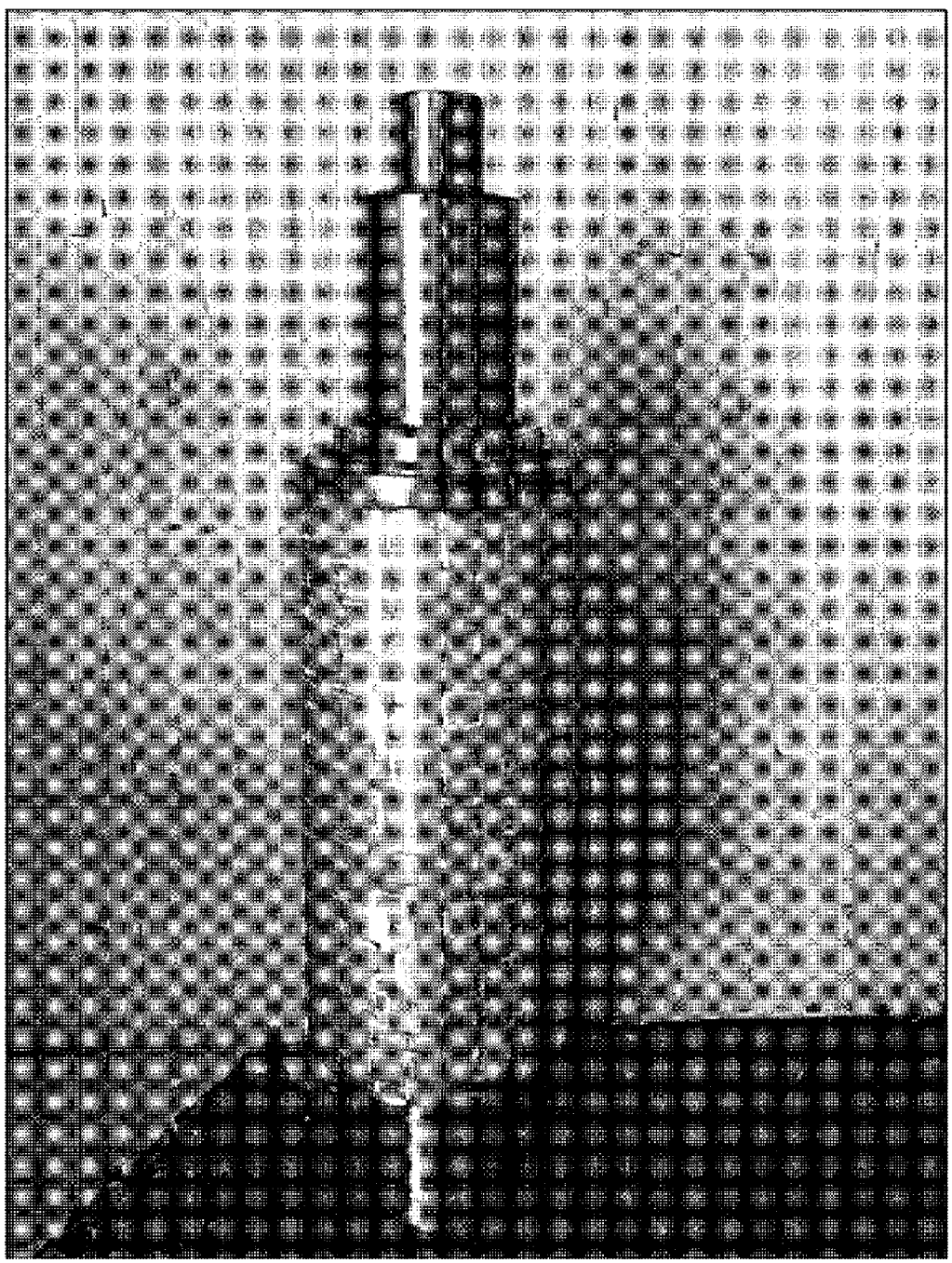
FIG. 31 is an actual image showing the roll stamp according to the present invention.

FIG. 28 is an actual image showing an example of a cylindrical metal mold according to the present invention, FIG. 29 is an actual image showing a dummy roller according to the present invention, FIG. 30 is an actual image showing a process of shrink-fitting the dummy roller into the cylindrical metal mold, and FIG. 31 is an actual image showing the roll stamp according to the present invention.

As described above, in the present invention, the cylindrical metal mold (see FIG. 28) including the third debossed pattern formed on the outer side and the hollow portion formed on the inner side may be manufactured and then the dummy roller (see FIG. 29) may be inserted using a shrink-fitting method (see FIG. 30) so that the roll stamp (see FIG. 31) is manufactured. Corresponding to the third debossed pattern of the cylindrical metal mold of the roll stamp (see FIG. 31), a predetermined pattern may be duplicated or transferred onto a target product.

Hereinafter, the roll stamp according to the present invention will be defined through measurement of reflectivity using a photometer.

As described above, the roll stamp according to the present invention includes the cylindrical metal mold including the debossed pattern formed on the outer side and the hollow portion formed on the inner side and includes the dummy roller inserted into the hollow portion.

Here, as in FIG. 6 described above, the method of manufacturing the roll stamp according to the present invention includes the providing of the object 110 including the first embossed pattern 111. This is the state in which the first embossed pattern 111 is duplicated as the debossed pattern included on the outer side of the cylindrical metal mold.

Meanwhile, the object 110 may be a natural object in a natural state such as natural fiber, natural leather, wood, and leaves, and the first embossed pattern 111 may be a natural pattern which is included in the natural object. Accordingly, in the present invention, a natural pattern which is included in a natural object in a natural state may be duplicated on a surface of metal, a film, an injection-molded product, or the like.

Figure 32:
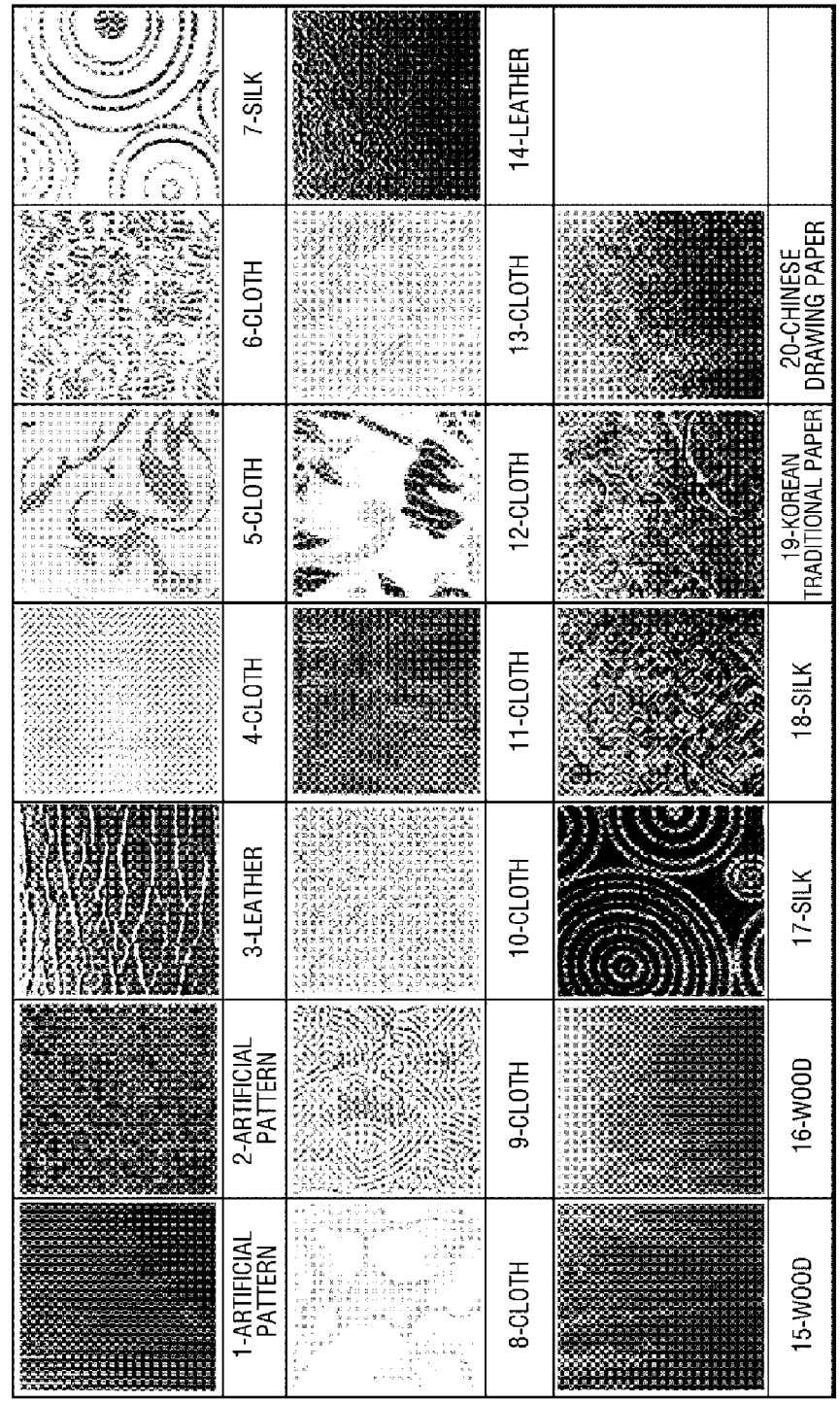
FIG. 32 shows actual images of samples on which various kinds of objects are duplicated.

FIG. 32 shows actual images of samples on which various kinds of objects are duplicated. Here, the samples in FIG. 32 are of a plate type. The samples of a plate type were manufactured to measure reflectivity as will be described below.

Meanwhile, samples 1 and 2 in FIG. 32 refer to plate-type samples on which a pattern is formed by machining as in FIG. 24, samples 3 and 14 in FIG. 32 refer to plate-type samples on which leather patterns, which are objects, are formed using the electroplating method according to the present invention, samples 4, 5, 6, 8, 9, 10, 11, 12, and 13 in FIG. 32 refer to plate-type samples on which various kinds of cloth patterns, which are objects, are formed using the electroplating method according to the present invention, samples 15 and 16 in FIG. 32 refer to plate-type samples on which various kinds of wood patterns, which are objects, are formed using the electroplating method according to the present invention, samples 7, 17, and 18 in FIG. 32 refer to plate-type samples on which various kinds of silk patterns, which are objects, are formed using the electroplating method according to the present invention, and samples 19 and 20 in FIG. 32 refer to plate-type samples on which Korean traditional paper patterns and Chinese drawing paper patterns, which are objects, are formed using the electroplating method according to the present invention.

Here, when it is said that a pattern is formed on a plate-type sample using the electroplating method according to the present invention, it can be understood that, through the process shown in FIGS. 6 to 12, a sample of the second metal mold 170 including the second debossed pattern 171, which is shown in FIG. 12, is manufactured.

Hereinafter, results of measuring reflectivity of the samples of FIG. 32, on which various kinds of objects are duplicated, using a photometer will be described.

Figure 33:
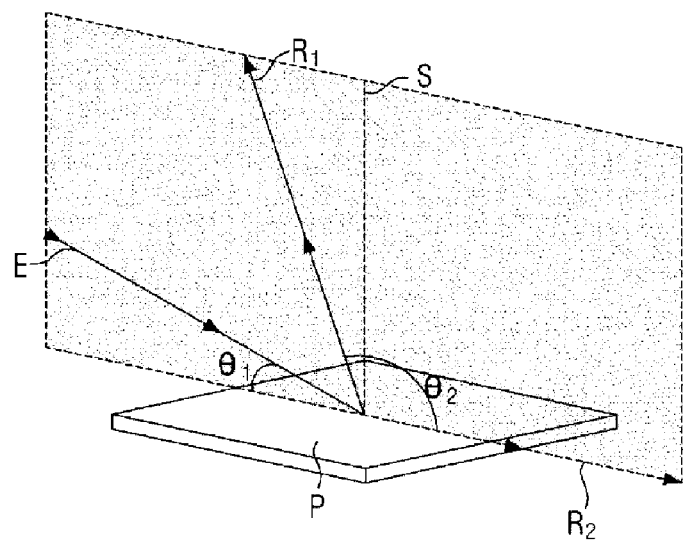
FIG. 33 is a schematic diagram for describing conditions for measuring reflectivity using a photometer.

FIG. 33 is a schematic diagram for describing conditions for measuring reflectivity using a photometer.

First, for the measurement of reflectivity using a photometer, Photon RT Spectrophotometer (manufacturer: ESSENTOPTICS Ltd. (Belarus)) was used.

Next, an angle of incidence θ1 of incident light E was set as 45° from a plane of a sample P, and a range of a measured angle θ2 of reflected lights R1 and R2 were set in a range of −20° to 90° from a virtual reference line S that is perpendicular to the plane of the sample P.

Figure 34:
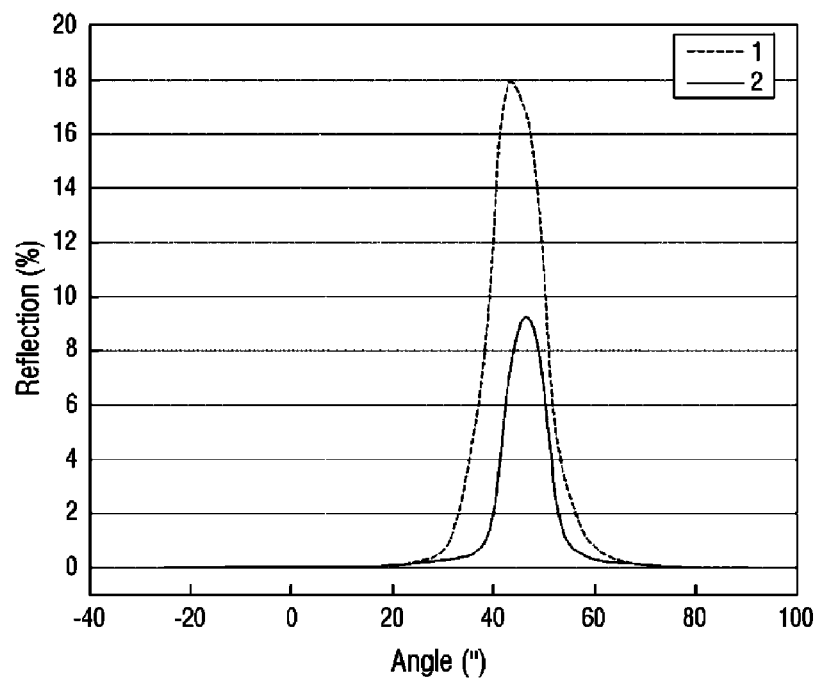
FIG. 34 is a graph showing results of measuring reflectivity of samples 1 and 2.

FIG. 34 is a graph showing results of measuring reflectivity of samples 1 and 2.

As illustrated in FIG. 34, a maximum value of reflectivity when a pattern is formed on a plate-type sample by machining, as in FIG. 24 described above, corresponds to 9% or higher. Particularly, it can be seen that the reflectivity is very high, i.e., 18%, for sample 1.

Meanwhile, because, as described above with reference to FIG. 33, the angle of incidence θ1 of the incident light E was set as 45° from the plane of the sample P for the measurement of reflectivity using a photometer, it can be seen that the maximum value of the reflectivity is in a range of 30° to 60°, which is a range of the measured angle θ2 of the reflected lights R1 and R2, and it can be seen that this tendency is the same for other samples.

Figure 35:
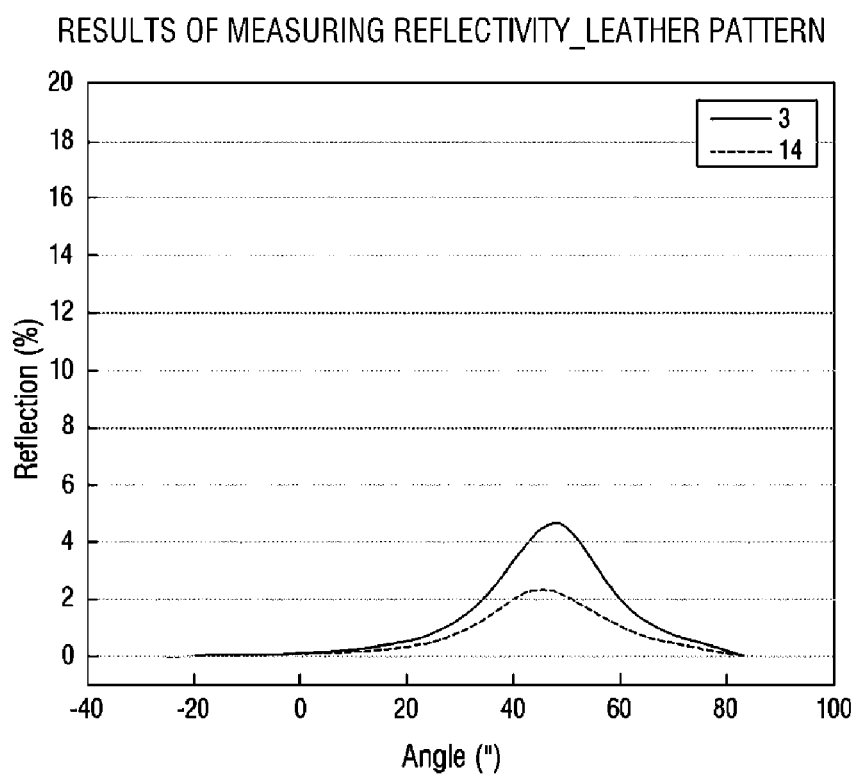
FIG. 35 is a graph showing results of measuring reflectivity of samples 3 and 14.

FIG. 35 is a graph showing results of measuring reflectivity of samples 3 and 14.

As illustrated in FIG. 35, a maximum value of reflectivity when leather patterns, which are objects, are formed on a plate-type sample using the electroplating method according to the present invention corresponds to 5% or lower. Particularly, it can be seen that the reflectivity is very low, i.e., 3% or lower, for sample 14.

Figure 36:
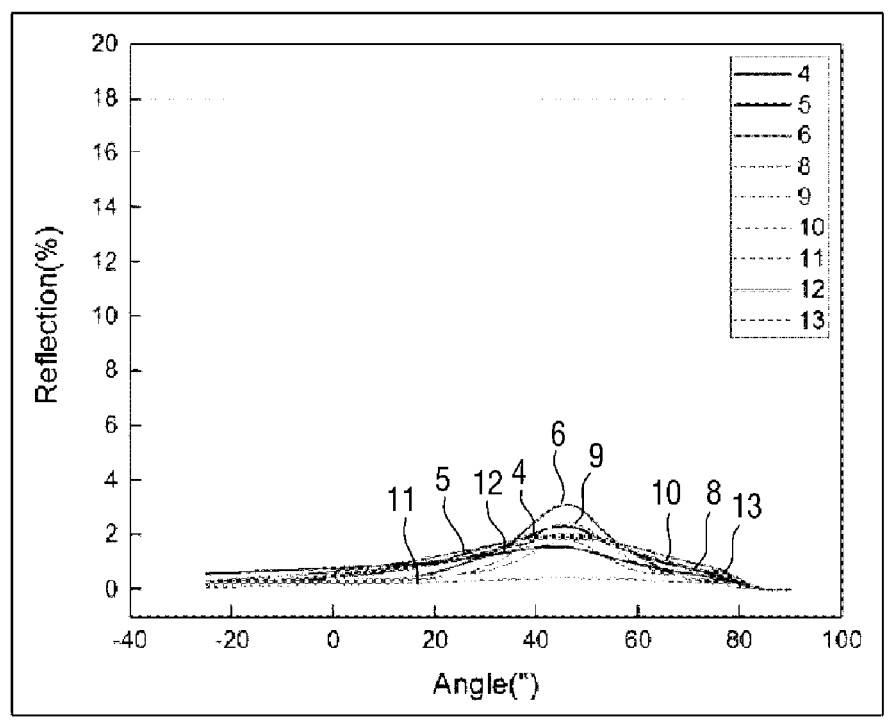
FIG. 36 is a graph showing results of measuring reflectivity of samples 4, 5, 6, 8, 9, 10, 11, 12, and 13.

FIG. 36 is a graph showing results of measuring reflectivity of samples 4, 5, 6, 8, 9, 10, 11, 12, and 13.

As illustrated in FIG. 36, a maximum value of reflectivity when various kinds of cloth patterns, which are objects, are formed on plate-type samples using the electroplating method according to the present invention corresponds to about 3% or lower. Particularly, it can be seen that the reflectivity is 1% or lower, which indicates that reflection hardly occurred, for sample 11.

Figure 37:
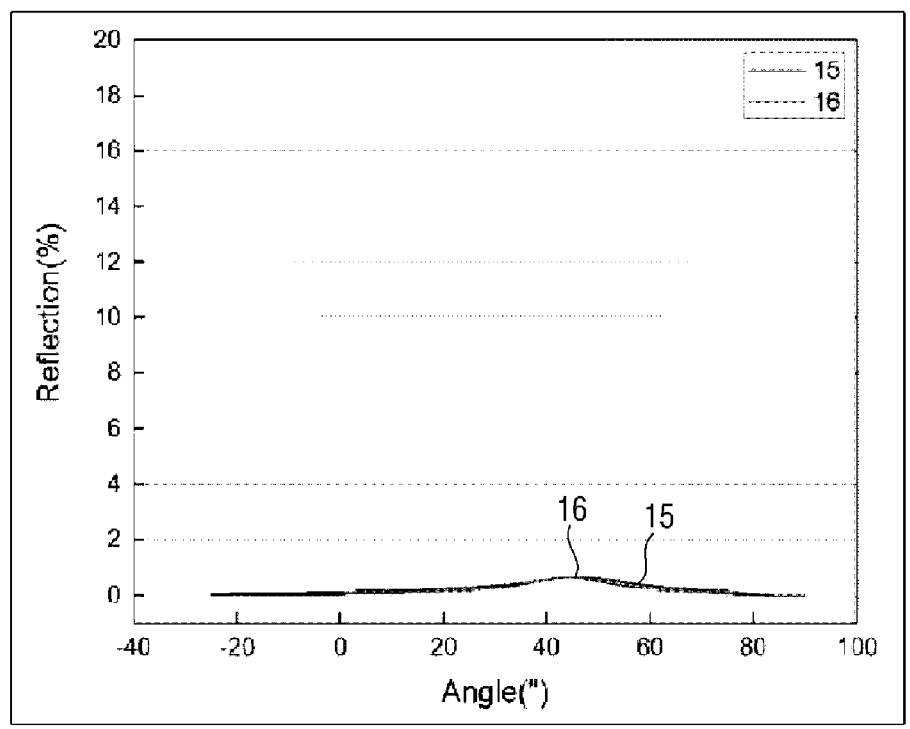
FIG. 37 is a graph showing results of measuring reflectivity of samples 15 and 16.

FIG. 37 is a graph showing results of measuring reflectivity of samples 15 and 16.

As illustrated in FIG. 37, a maximum value of reflectivity when various kinds of wood patterns, which are objects, are formed on plate-type samples using the electroplating method according to the present invention corresponds to about 1% or lower, which indicates that reflection hardly occurred.

Figure 38:
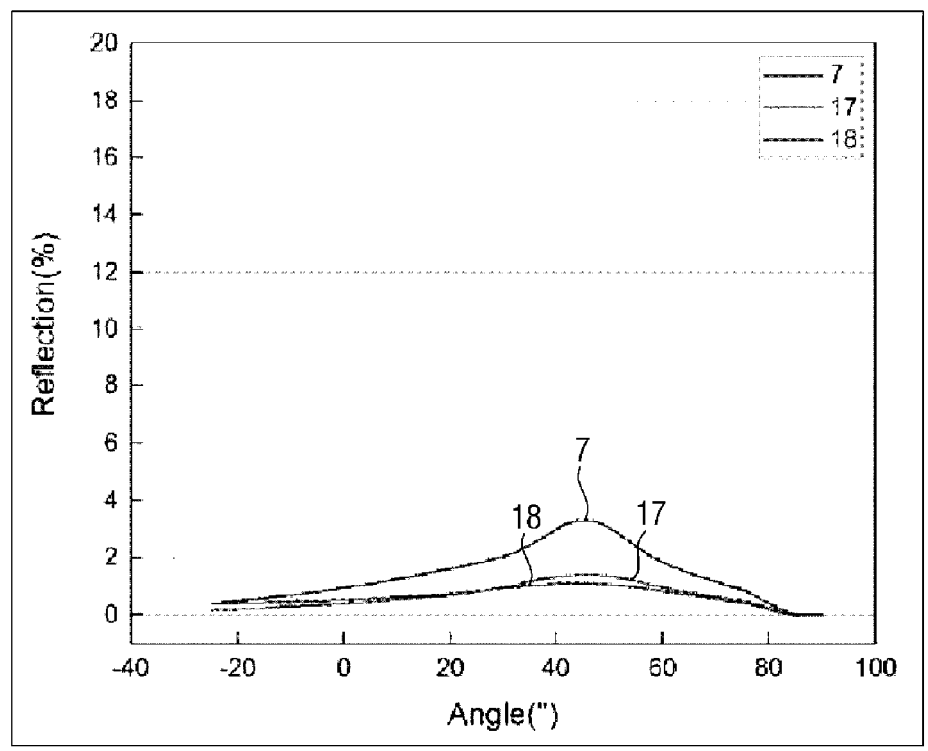
FIG. 38 is a graph showing results of measuring reflectivity of samples 7, 17, and 18.

FIG. 38 is a graph showing results of measuring reflectivity of samples 7, 17, and 18.

As illustrated in FIG. 38, a maximum value of reflectivity when various kinds of silk patterns, which are objects, are formed on plate-type samples using the electroplating method according to the present invention corresponds to 4% or lower. Particularly, it can be seen that the reflectivity is very low, i.e., 2% or lower, for samples 17 and 18.

Figure 39:
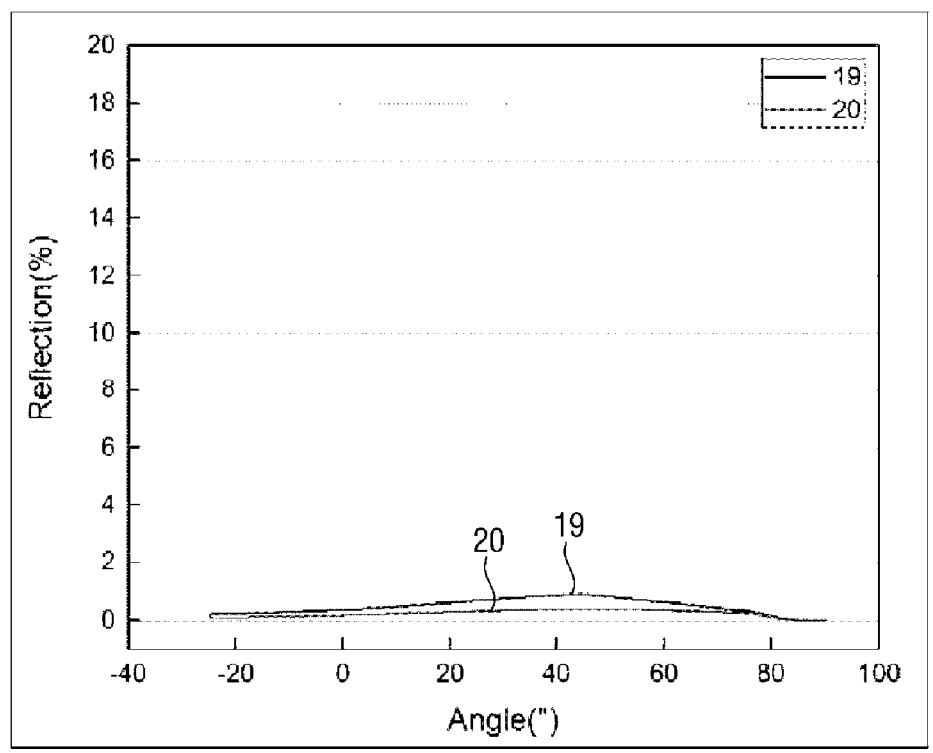
FIG. 39 is a graph showing results of measuring reflectivity of samples 19 and 20.

FIG. 39 is a graph showing results of measuring reflectivity of samples 19 and 20.

As illustrated in FIG. 39, a maximum value of reflectivity when Korean traditional paper patterns and Chinese drawing paper patterns, which are objects, are formed on plate-type samples using the electroplating method according to the present invention corresponds to about 1% or lower, which indicates that reflection hardly occurred.

According to the above results, referring to FIG. 34, the maximum value of the reflectivity when a pattern is formed on a plate-type sample by machining, as in FIG. 24 described above, corresponds to 9% or higher. Particularly, it can be seen that the reflectivity is very high, i.e., 18%, for sample 1.

However, referring to FIGS. 35 to 39, the maximum value of the reflectivity when a pattern is formed on a plate-type sample using the electroplating method according to the present invention corresponds to 5% or lower.

Meanwhile, although the reflectivity has been described above on the basis of the case in which a pattern is formed on a plate-type sample, when the process shown in FIGS. 13 to 18 is performed using the second metal mold 170 including the second debossed pattern 171 as illustrated in FIG. 12 so as to manufacture the roll stamp 240 which includes the cylindrical metal mold 220 including the third debossed pattern 221 formed on the outer side and the hollow portion 222 formed on the inner side as illustrated in FIG. 18, the reflectivity of the cylindrical metal mold 220 including the third debossed pattern 221 formed on the outer side and the hollow portion 222 formed on the inner side may be expected to correspond to a result identical or similar to the reflectivity shown in FIGS. 35 to 39.

Therefore, the maximum value of the reflectivity of the cylindrical metal mold according to the present invention may be defined as exceeding 0 and being 5% or lower.

As described above with reference to FIGS. 24 and 25, in order to implement texture of a silk material as described above on a metal material after forming a pattern by machining, mechanically, a high-durability, ultra-precision tip capable of processing in hundreds of nanometers and tens to hundreds of micrometers is required, and, three-dimensionally, a task of finding an exact position and performing processing repeatedly is required. This corresponds to a technology that is not economically or technically possible.

However, in the present invention, both the imprinting process and the electroplating process used in the process of manufacturing the cylindrical metal mold correspond to a technology capable of implementing fine patterns in micro-units. Thus, the third debossed pattern formed on the outer side of the cylindrical metal mold may also be implemented as a fine pattern in micro-units.

Due to such a difference, the debossed pattern of the cylindrical metal mold according to the present invention corresponds to a pattern that is finer than a pattern formed by machining Thus, it is determined that the reflectivity when a pattern is formed on the cylindrical metal mold using the electroplating method is lower than the reflectivity when a pattern is formed on the cylindrical metal mold by machining Therefore, the roll stamp according to the present invention includes: the cylindrical metal mold including the debossed pattern formed on the outer side and the hollow portion formed on the inner side; and the dummy roller inserted into the hollow portion, wherein the maximum value of the reflectivity of the cylindrical metal mold is defined as exceeding 0 and being 5% or lower.

Meanwhile, because, as described above with reference to FIG. 33, the angle of incidence θ1 of the incident light E was set as 45° from the plane of the sample P for the measurement of reflectivity using a photometer, it can be seen that the maximum value of the reflectivity is in the range of 30° to 60°, which is the range of the measured angle θ2 of the reflected lights R1 and R2.

Therefore, the maximum value of the reflectivity of the cylindrical metal mold may be defined as being present in the range of 30° to 60°, which is the range of the measured angle θ2 of reflected lights R1 and R2 under a condition in which the angle of incidence θ1 of the incident light E is 45° from the plane of the sample P.

However, the definition of the maximum value of the reflectivity corresponds to an example. It can be predicted that, even when reflectivity is measured under various conditions, only the range of a measured angle of reflected light in which the maximum value is present will change, and there will be no change to a numerical value of the maximum value of the reflectivity.

Modes of the Invention

Figure 57:
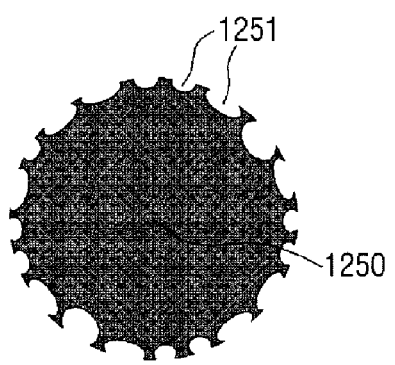
Figure 58:
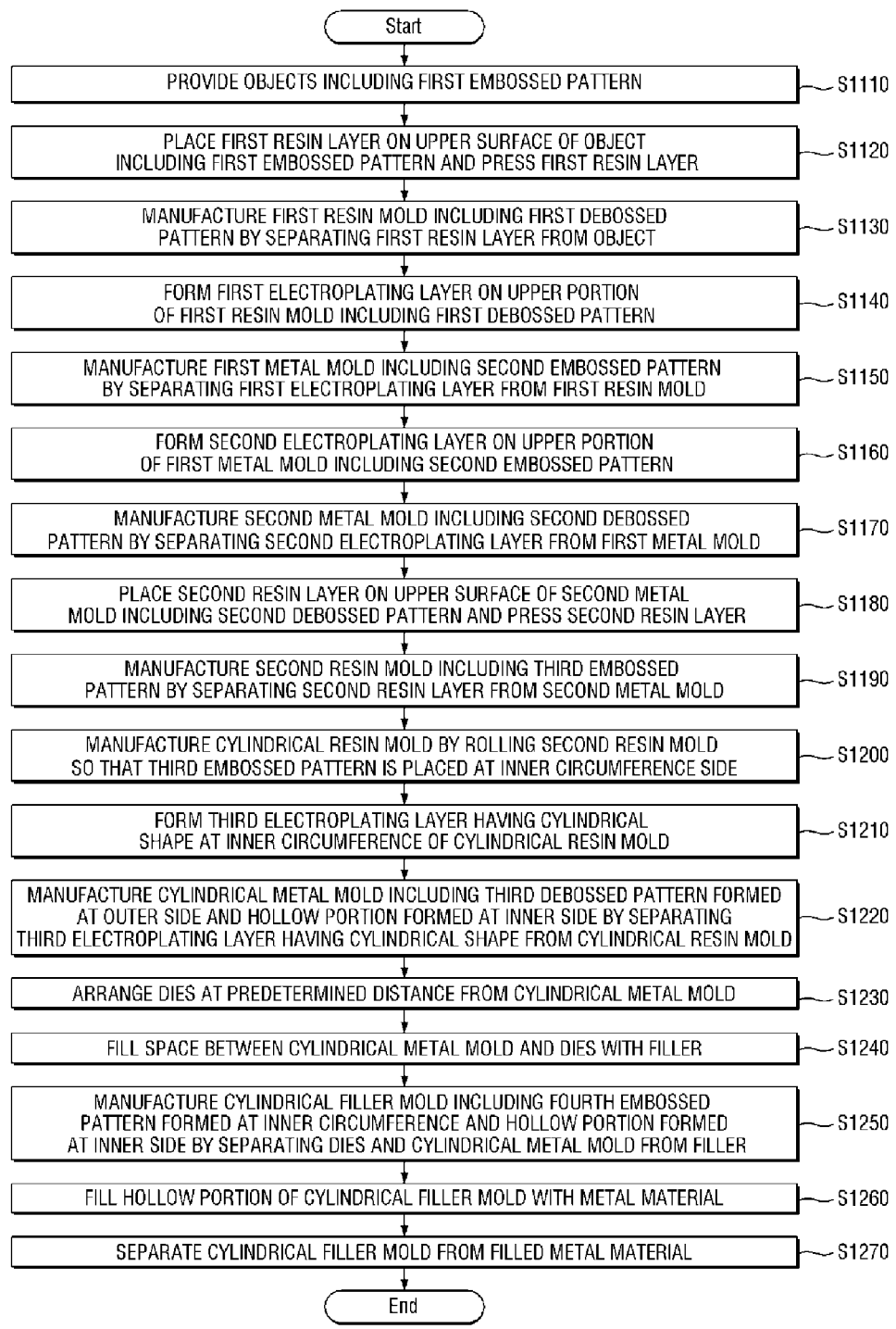
FIG. 58 is a flowchart for describing the method of manufacturing the roll stamp for an imprint apparatus according to the second embodiment of the present invention.

FIGS. 40 to 57 are schematic diagrams for describing a method of manufacturing a roll stamp for an imprint apparatus according to a second embodiment of the present invention, and FIG. 58 is a flowchart for describing the method of manufacturing the roll stamp for an imprint apparatus according to the second embodiment of the present invention.

Figure 40:
FIGS. 40 to 57 are schematic diagrams for describing a method of manufacturing a roll stamp for an imprint apparatus according to a second embodiment of the present invention.

First, referring to FIGS. 40 and 58, the method of manufacturing the roll stamp for an imprint apparatus according to the second embodiment of the present invention includes providing an object 1110 including a first embossed pattern 1111 (S1110).

Here, the object 1110 may be a natural object in a natural state such as natural fiber, natural leather, wood, and leaves, and the first embossed pattern 1111 may be a natural pattern which is included in the natural object.

That is, in the present invention, a natural pattern which is included in a natural object in a natural state may be duplicated on a surface of metal, a film, an injection-molded product, or the like, which will be described below.

Figure 41:
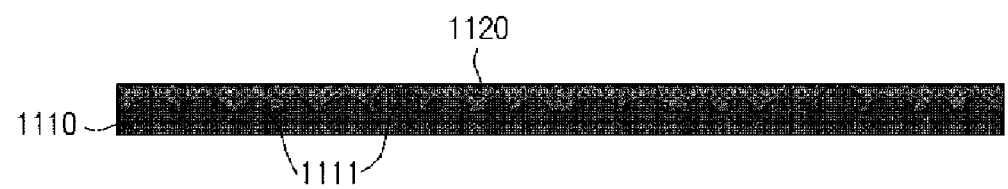

Next, referring to FIGS. 41 and 58, the method of manufacturing the roll stamp for an imprint apparatus according to the second embodiment of the present invention includes placing a first resin layer 1120 on an upper surface of the object 1110 including the first embossed pattern 1111 and pressing the first resin layer (S1120).

This corresponds to a general imprinting process. Because the imprinting process is self-evident to those of ordinary skill in the art, detailed description thereof will be omitted.

Thermoplastic resin such as polymethyl methacrylate (PMMA) or acrylate-based photocurable resin may be used as a material of the first resin layer 1120, but the material of the first resin layer 1120 is not limited thereto in the present invention.

Figure 42:

Next, referring to FIGS. 42 and 58, the method of manufacturing the roll stamp for an imprint apparatus according to the second embodiment of the present invention includes manufacturing a first resin mold 1130 including a first debossed pattern 1131 by separating the first resin layer 1120 from the object 1110 (S1130).

Here, the first resin layer 1120 may be thermally cured or photocured before the first resin layer 1120 is separated from the object 1110, or, conversely, the first resin layer 1120 may be thermally cured or photocured after the first resin layer 1120 is separated from the object 1110.

Meanwhile, the first debossed pattern 1131 is formed to correspond to the first embossed pattern 1111.

By applying pressure to the first resin layer 1120 in Step S1120, a partial region of the first resin layer 1120 is deformed into a debossed shape corresponding to the first embossed pattern 1111. In this way, the first debossed pattern 1131 is formed to correspond to the first embossed pattern 1111.

Figure 43:

Next, referring to FIGS. 43 and 58, the method of manufacturing the roll stamp for an imprint apparatus according to the second embodiment of the present invention includes forming a first electroplating layer 1140 on an upper portion of the first resin mold 1130 including the first debossed pattern 1131 (S1140).

The first electroplating layer 1140 may be formed by performing an electroless plating method in which at least one or more of copper (Cu), nickel (Ni), silver (Ag), chromium (Cr), iron (Fe), and cobalt (Co) is plated.

The electroless plating method is a plating method using a chemical reaction caused by an autocatalysis. Unlike in electroplating, a film is formed even when electricity does not pass through an object to be plated. A film may be formed on almost all materials such as plastic, paper, fiber, and ceramics, in addition to metal.

A film may also be formed on a material of a complex structure. The formed film has excellent physical properties in terms of corrosion resistance, alkali resistance, abrasion resistance, solderability, adhesiveness, heat resistance, and the like. Thus, the film is widely applied to automobiles, aircraft, general machinery, electronic parts, and chemical plants.

Because the electroless plating method is self-evident to those of ordinary skill in the art, detailed description thereof will be omitted. However, the method of forming the first electroplating layer and the material of the plating layer are not limited to the above in the present invention.

Figure 44:

Next, referring to FIGS. 44 and 58, the method of manufacturing the roll stamp for an imprint apparatus according to the second embodiment of the present invention includes manufacturing a first metal mold 1150 including a second embossed pattern 1151 by separating the first electroplating layer 1140 from the first resin mold 1130 (S1150).

Here, the separating of the first electroplating layer 1140 from the first resin mold 1130 may be performed well due to releasability according to the materials of the first resin mold 1130 and the first electroplating layer 1140.

Meanwhile, the second embossed pattern 1151 is formed to correspond to the first debossed pattern 1131.

Because the electroless plating method in Step S1130 allows even a material of a complex structure to be plated well, the second embossed pattern 1151 may be easily formed along a surface of the first debossed pattern 1131. Accordingly, the second embossed pattern 1151 is formed to correspond to the first debossed pattern 1131.

Here, because the second embossed pattern 1151 is formed to correspond to the first debossed pattern 1131 and the first debossed pattern 1131 is formed to correspond to the first embossed pattern 1111, the second embossed pattern 1151 is formed in the same shape as the first embossed pattern 1111.

That is, the first embossed pattern 1111 which is included in the object 1110 is duplicated as the second embossed pattern 1151 of the first metal mold 1150. Accordingly, when the object is a natural object in a natural state, the second embossed pattern 1151 may be a natural pattern which is included in the natural object.

Figure 45:

Next, referring to FIGS. 45 and 58, the method of manufacturing the roll stamp for an imprint apparatus according to the second embodiment of the present invention includes forming a second electroplating layer 1160 on an upper portion of the first metal mold 150 including the second embossed pattern 1151 (S1160).

The second electroplating layer 1160 may be formed by performing an electroless plating method or an electroplating method in which at least one or more of Cu, Ni, Ag, Cr, Fe, and Co is plated.

Because the electroless plating method or electroplating method for forming the plating layer is self-evident to those of ordinary skill in the art, detailed description thereof will be omitted. However, the method of forming the second electroplating layer and the material of the plating layer are not limited to the above in the present invention.

Figure 46:

Next, referring to FIGS. 46 and 58, the method of manufacturing the roll stamp for an imprint apparatus according to the second embodiment of the present invention includes manufacturing a second metal mold 1170 including a second debossed pattern 1171 by separating the second electroplating layer 1160 from the first metal mold 1150 (S1170).

Meanwhile, in order to facilitate the separating of the second electroplating layer 1160 from the first metal mold 1150, preferably, a release layer (not illustrated) is included between the first metal mold 1150 and the second electroplating layer 1160.

Here, the release layer (not illustrated) may be a chromate layer.

The chromate layer will be described in more detail. For example, Fe is corroded due to salt, moisture in the atmosphere, or ions. Because corrosion of an oxide layer of Fe continuously progresses unlike corrosion of an oxide layer of Cr, aluminum, or the like, depth corrosion occurs.

In order to address this, a method of suppressing corrosion by plating or coating a surface with zinc (Zn) or zinc alloy (Zn alloy) has been commonly used. A metal plated with Zn or Zn alloy is widely used as a rust-prevention metal for automobiles, home appliances, construction materials, and the like that require corrosion resistance.

However, pure Zn has a drawback in that corrosion of Zn plating itself progresses very rapidly in a corrosive environment in which salt spray or the like occurs. Also, pure Zn is prone to generating conductive zinc oxide (ZnO) as the product of corrosion, and a decrease in a surface protection effect due to the product of corrosion present on the surface also acts as a factor that reduces corrosion resistance.

Therefore, as a method of suppressing the corrosion of Zn, it is common to perform chromate treatment in which a Zn film or a Zn alloy film is coated with Cr.

The chromate process for forming a chromate layer is a process corresponding to the final treatment after performing a Zn plating process. Generally, a chromate solution for performing the chromate treatment may be made using a mixture of hexavalent chromic anhydride, sodium bichromate, and acid. The chromate layer may also be formed by trivalent chromate using trivalent Cr.

Through the known method of forming a chromate layer, the release layer (not illustrated) may be formed between the first metal mold 1150 and the second electroplating layer 1160. For example, the release layer (not illustrated) may be formed at the upper portion of the first metal mold 1150 including the second embossed pattern 151, and then the second electroplating layer 1160 may be formed at an upper portion of the release layer.

As described above, because the release layer (not illustrated) has high releasability, the separating of the second electroplating layer 1160 from the first metal mold 1150 may be easily performed.

Also, because the release layer of the chromate layer has conductivity, the chromate layer may serve as an electrode in a plating process for forming the second electroplating layer.

That is, the chromate layer is a material having electrical conductivity and may add high releasability between the first metal mold 1150 and the second electroplating layer 1160.

Figure 47:

Next, referring to FIGS. 47 and 58, the method of manufacturing the roll stamp for an imprint apparatus according to the second embodiment of the present invention includes placing a second resin layer 1180 on an upper surface of the second metal mold 1170 including the second debossed pattern 1171 and pressing the second resin layer (S1180).

This corresponds to a general imprinting process. Because the imprinting process is self-evident to those of ordinary skill in the art, detailed description thereof will be omitted.

Thermoplastic resin such as PMMA or acrylate-based photocurable resin may be used as a material of the second resin layer 1180, but the material of the second resin layer 1180 is not limited thereto in the present invention.

Figure 48:

Next, referring to FIGS. 48 and 58, the method of manufacturing the roll stamp for an imprint apparatus according to the second embodiment of the present invention includes manufacturing a second resin mold 1190 including a third embossed pattern 1191 by separating the second resin layer 1180 from the second metal mold 1170 (S1190).

Here, the second resin layer 1180 may be thermally cured or photocured before the second resin layer 1180 is separated from the second metal mold 1170, or, conversely, the second resin layer 1180 may be thermally cured or photocured after the second resin layer 1180 is separated from the second metal mold 1170.

Meanwhile, the third embossed pattern 1191 is formed to correspond to the second debossed pattern 1171.

By applying pressure to the second resin layer 1180 in Step S1180, a partial region of the second resin layer 1180 is deformed into an embossed shape corresponding to the second debossed pattern 1171. In this way, the third embossed pattern 1191 is formed to correspond to the second debossed pattern 1171.

Meanwhile, the third embossed pattern 1191 is formed in the same shape as the first embossed pattern 1111.

That is, the first embossed pattern 1111 which is included in the object 1110 is duplicated as the third embossed pattern 1191 of the second resin mold 1190. Accordingly, when the object is a natural object in a natural state, the third embossed pattern 1191 may be a natural pattern which is included in the natural object.

Figure 49:
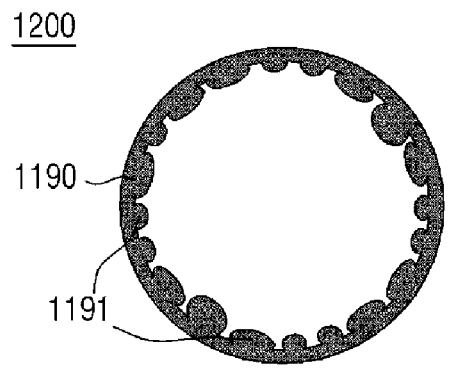

Next, referring to FIGS. 49 and 58, the method of manufacturing the roll stamp for an imprint apparatus according to the second embodiment of the present invention includes manufacturing a cylindrical resin mold 1200 by rolling the second resin mold 1190 so that the third embossed pattern 1191 is placed on an inner circumference side (S1200).

Due to being formed of thermoplastic resin such as PMMA or acrylate-based photocurable resin, the second resin mold 1190 may be easily rolled into a cylindrical shape. Also, edge regions of the second resin mold 1190 may be easily joined using a known adhesive material.

Here, as mentioned above, the third embossed pattern 1191 should be placed on an inner circumference side of the cylindrical resin mold 1200.

Figure 50:
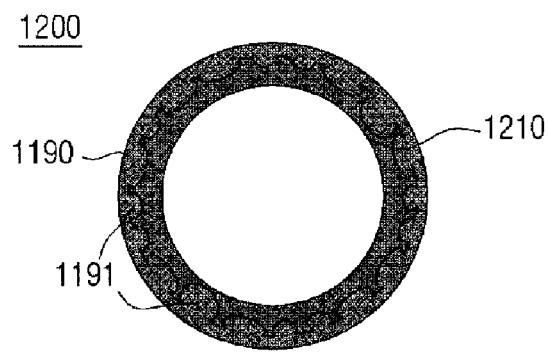

Next, referring to FIGS. 50 and 58, the method of manufacturing the roll stamp for an imprint apparatus according to the second embodiment of the present invention includes forming a third electroplating layer 1210 having a cylindrical shape on an inner circumference of the cylindrical resin mold 1200 (S1210).

The third electroplating layer 1210 may be formed by performing an electroless plating method in which at least one or more of Cu, Ni, Ag, Cr, Fe, and Co is plated.

Because the electroless plating method is self-evident to those of ordinary skill in the art, detailed description thereof will be omitted. However, the method of forming the third electroplating layer and the material of the plating layer are not limited to the above in the present invention.

Figure 51:
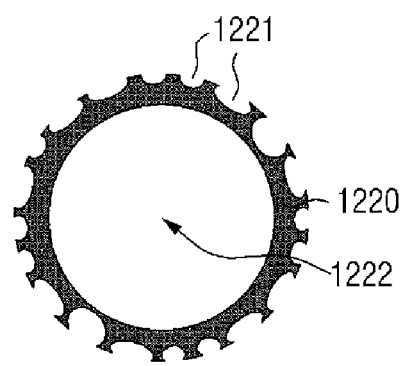

Next, referring to FIGS. 51 and 58, the method of manufacturing the roll stamp for an imprint apparatus according to the second embodiment of the present invention includes manufacturing a cylindrical metal mold 1220 including a third debossed pattern 1221 formed on an outer side and a hollow portion 1222 formed on an inner side by separating the third electroplating layer 1210 having a cylindrical shape from the cylindrical resin mold 1200 (S1220).

Here, the separating of the third electroplating layer 1210 having a cylindrical shape from the cylindrical resin mold 1200 may be performed well due to releasability according to the materials of the cylindrical resin mold 1200 and the third electroplating layer 1210.

Meanwhile, the third debossed pattern 1221 is formed to correspond to the third embossed pattern 1191.

Because the electroless plating method in Step S1210 allows even a material of a complex structure to be plated well, the third debossed pattern 1221 may be easily formed along a surface of the third embossed pattern 1191. Accordingly, the third debossed pattern 1221 is formed to correspond to the third embossed pattern 1191.

Here, because the third embossed pattern 1191 is formed in the same shape as the first embossed pattern 1111, accordingly, the third debossed pattern 1221 is formed to correspond to the first embossed pattern 1111.

Figure 52:
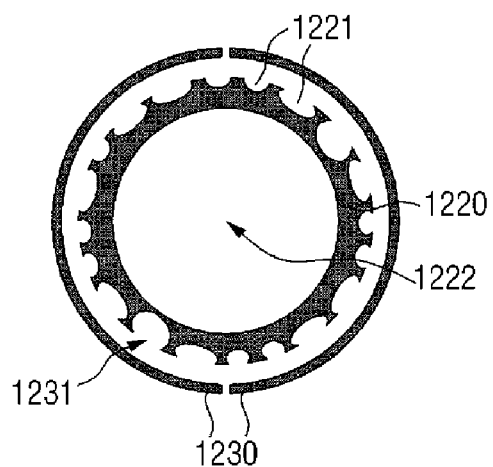

Next, referring to FIGS. 52 and 58, the method of manufacturing the roll stamp for an imprint apparatus according to the second embodiment of the present invention includes arranging dies 1230 at a predetermined distance 1231 from the cylindrical metal mold 1220 (S1230).

Here, as illustrated in FIG. 52, in order to allow two semi-cylindrical dies to form a single cylindrical shape, preferably, the dies 1230 are arranged to be separated.

Figure 53:
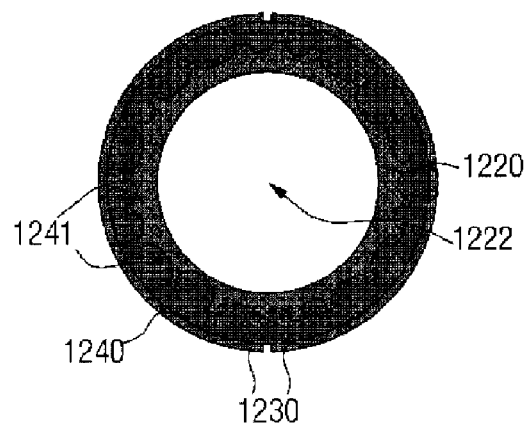

Next, referring to FIGS. 53 and 58, the method of manufacturing the roll stamp for an imprint apparatus according to the second embodiment of the present invention includes filling a space between the cylindrical metal mold 1220 and the dies 1230 with a filler 1240 (S1240).

Here, the filler may be plaster or cast metal.

However, taking into consideration that the cylindrical metal mold and the dies are formed of metal, in order to easily separate the filler from the cylindrical metal mold and the dies, preferably, the filler is plaster. However, the kind of the filler is not limited thereto in the present invention.

Figure 54:
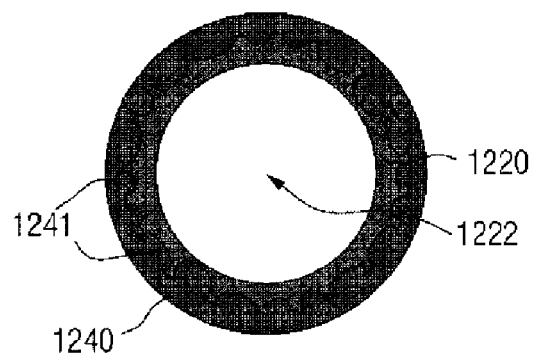
Figure 55:
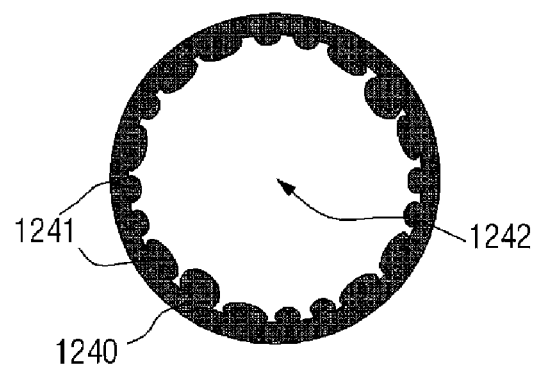

Next, referring to FIGS. 54, 55, and 58, the method of manufacturing the roll stamp for an imprint apparatus according to the second embodiment of the present invention includes manufacturing a cylindrical filler mold 1240 including a fourth embossed pattern 1241 formed on an inner circumference and a hollow portion 1242 formed on an inner side by separating the dies 1230 and the cylindrical metal mold 1220 from the filler 1240 (S1250).

Here, when the filler is plaster, the cylindrical filler mold may be defined as a cylindrical plaster mold, or, when the filler is cast metal, the cylindrical filler mold may be defined as a cylindrical cast mold.

Also, the fourth embossed pattern 1241 is formed in the same shape as the first embossed pattern 1111.

Meanwhile, as illustrated in FIG. 54, by configuring the dies 1230 so that two semi-cylindrical dies form a single cylindrical shape as described above, the separating of the dies 1230 from the filler 1240 may be performed by separating the semi-cylindrical dies from the filler 1240.

Also, the separating of the cylindrical metal mold 1220 from the filler 1240 may be performed by cutting the filler 1240 into two semi-cylindrical shapes and then separating the semi-cylindrical shaped pieces of the filler from the cylindrical metal mold 1220.

Figure 56:
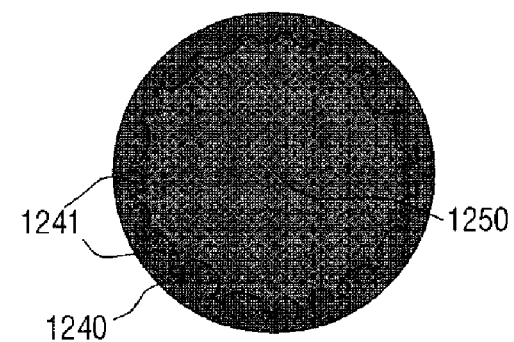

Next, referring to FIGS. 56 and 58, the method of manufacturing the roll stamp for an imprint apparatus according to the second embodiment of the present invention includes filling the hollow portion 1242 of the cylindrical filler mold 1240 with a metal material 1250 (S1260).

Here, the metal material is not particularly limited as long as the material is capable of being injected in a molten state and then coagulated to form a cast metal. For example, the metal material may be Fe-based metal, Cu-based metal, or the like, but the kind of the metal material is not limited thereto in the present invention.

Next, referring to FIGS. 57 and 58, the method of manufacturing the roll stamp for an imprint apparatus according to the second embodiment of the present invention includes separating the cylindrical filler mold 1240 from the filled metal material (S1270). In this way, a roll stamp 1250 including a fourth debossed pattern 1251 formed at an outer circumference according to the second embodiment of the present invention may be manufactured.

Here, the fourth debossed pattern 1251 is formed in a shape corresponding to the fourth embossed pattern 1241. Because the logic is the same as described above, detailed description thereof will be omitted.

Meanwhile, although not illustrated in the drawings, a shaft (not illustrated) may be installed at the center of the roll stamp 1250, and, by rotating the shaft, the roll stamp 1250 may rotate.

Figure 59:
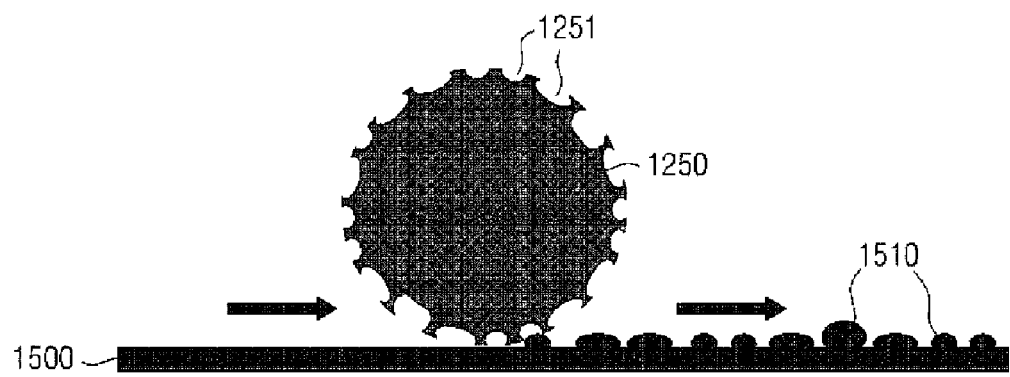
FIG. 59 is a schematic diagram illustrating transferring of patterns using the roll stamp according to the second embodiment of the present invention.
Figure 60:
FIG. 60 is a view illustrating a product onto which a pattern is transferred using the roll stamp according to the second embodiment of the present invention.

FIG. 59 is a schematic diagram illustrating transferring of patterns using the roll stamp according to the present invention, and FIG. 60 is a view illustrating a product onto which a pattern is transferred using the roll stamp according to the present invention.

First, referring to FIG. 59, a shaft (not illustrated) may be installed at the center of the roll stamp 1250 according to the present invention, and, by rotating the shaft, the roll stamp 1250 may rotate.

Here, a target product 1500 onto which a pattern will be transferred is placed below the roll stamp 1250, and, when the target product 1500 moves along with rotation of the roll stamp 1250, a predetermined pattern 1510 is formed on a surface of the target product 1500.

Meanwhile, the target product 1500 may be metal, a film, an injection-molded product, or the like, but the kinds of target products onto which a pattern will be transferred are not limited thereto in the present invention.

As more specific application examples, the present invention may be applied to interior and exterior materials of home appliances such as a mobile phone, a laptop, an MP3 player, a camera, a refrigerator, and an air conditioner, interior and exterior materials of buildings such as an elevator, a fire door, and wallpaper, and interior and exterior materials of transportation equipment such as an aircraft, a cruise ship, and a yacht. The present invention may also be applied to lids of various cosmetic containers, various beverage containers, and the like.

That is, due to pressing of the roll stamp 1250, the predetermined pattern 1510 is formed in a shape corresponding to the fourth debossed pattern 1251 placed on the outer side of the roll stamp 1250.

Here, as described above, because the fourth debossed pattern 1251 is formed in a shape corresponding to the fourth embossed pattern 1241 and the fourth embossed pattern 1241 is formed in the same shape as the first embossed pattern 1111, accordingly, the predetermined pattern 1510, which is formed in a shape corresponding to the fourth debossed pattern 1251, is formed in the same shape as the first embossed pattern 1111.

That is, as illustrated in FIG. 60, the first embossed pattern 1111 which is included in the object 1110 is duplicated as the predetermined pattern 1510 of the target product 1500. Accordingly, when the object is a natural object in a natural state, the predetermined pattern 1510 may be a natural pattern which is included in the natural object.

Therefore, in the present invention, a natural pattern which is included in a natural object in a natural state may be duplicated on a surface of a target product such as metal, a film, or an injection-molded product.

Meanwhile, as described above, referring to FIGS. 1 to 3, the first method of manufacturing a conventional roll stamp has disadvantages in that, because the edge regions of the plate 20 are separated at the joining portion 24, the roll stamp 30 is not able to perform its function, and, because it is difficult for patterns to be connected to have continuity at the joining portion 24, it is difficult to perform a patterning process continuously.

Also, referring to FIGS. 4 and 5, the second method of manufacturing a conventional roll stamp, i.e. directly forming the pattern 12 to be transferred on the outer surface of the dummy roller 10 through direct patterning technology using a laser or the like, has a problem in that it is difficult to implement fine patterns of tens of microns or less using the direct patterning technology.

However, in the present invention, by the process described above, the hollow portion 1242 of the cylindrical filler mold 1240 is filled with the metal material 1250, and then the cylindrical filler mold 1240 is separated from the filled metal material so that the roll stamp 1250 including the fourth debossed pattern 1251 formed on the outer circumference is manufactured. Thus, because a joining portion (seam) is not formed on the entire area of the roll stamp 1250, a problem in which edge regions are separated does not occur. Also, due to the absence of the joining portion, it is possible to perform a patterning process continuously.

Also, in the present invention, both the imprinting process and the electroplating process, which are used in the process of manufacturing the roll stamp 1250, correspond to a technology capable of implementing fine patterns in micro-units. Therefore, the fourth debossed pattern 1251 formed on the outer side of the roll stamp 1250 may also be implemented as a fine pattern in micro-units, and thus, the predetermined pattern 1510 of the target product 1500 that is formed by the fourth debossed pattern 1251 may also be duplicated as a fine pattern in micro-units.

Embodiments of the present invention have been described above with reference to the accompanying drawings, but those of ordinary skill in the art to which the present invention pertains should understand that the present invention may be practiced in other specific forms without changing the technical idea or essential features of the present invention. Therefore, the above-described embodiments should be understood as being illustrative in all aspects rather than being restrictive.

The invention claimed is:

1. A method of manufacturing a roll stamp, the method comprising:
   providing an object including a first embossed pattern;
   placing a first resin layer on an upper surface of the object including the first embossed pattern and pressing the first resin layer;

manufacturing a first resin mold including a first debossed pattern by separating the first resin layer from the object;

forming a first metal layer on an upper portion of the first resin mold including the first debossed pattern;

manufacturing a first metal mold including a second embossed pattern by separating the first metal layer from the first resin mold;

forming a second metal layer on an upper portion of the first metal mold including the second embossed pattern;

manufacturing a second metal mold including a second debossed pattern by separating the second metal layer from the first metal mold;

placing a second resin layer on an upper surface of the second metal mold including the second debossed pattern and pressing the second resin layer;

manufacturing a second resin mold including a third embossed pattern by separating the second resin layer from the second metal mold;

manufacturing a cylindrical resin mold by rolling the second resin mold so that the third embossed pattern is placed on an inner circumference side of the cylindrical resin mold;

forming a third metal layer having a cylindrical shape on the inner circumference of the cylindrical resin mold;

manufacturing a cylindrical metal mold including a third debossed pattern formed on an outer side and a hollow portion formed on an inner side by separating the third metal layer having a cylindrical shape from the cylindrical resin mold;

arranging dies at a predetermined distance from the cylindrical metal mold;

filling a space between the cylindrical metal mold and the dies with a filler;

manufacturing a cylindrical filler mold including a fourth embossed pattern formed on an inner circumference and a hollow portion formed on an inner side by separating the dies and the cylindrical metal mold from the filler;

filling the hollow portion of the cylindrical filler mold with a metal material; and separating the cylindrical filler mold from the filled metal material.

2. The method of claim 1, wherein each of the first resin mold and the second resin mold is formed of thermoplastic resin.

3. The method of claim 1, wherein:

the first metal layer is formed by performing an electroless plating method in which at least one or more of copper (Cu), nickel (Ni), silver (Ag), chromium (Cr), iron (Fe), and cobalt (Co) is plated;

the second metal layer is formed by performing an electroless plating method or an electroplating method in which at least one or more of Cu, Ni, Ag, Cr, Fe, and Co is plated; and the third metal layer is formed by performing an electroless plating method in which at least one or more of Cu, Ni, Ag, Cr, Fe, and Co is plated.

4. The method of claim 1, wherein the forming of the second metal layer on the upper portion of the first metal mold including the second embossed pattern includes forming a release layer on the upper portion of the first metal mold including the second embossed pattern and then forming the second metal layer on an upper portion of the release layer.

5. The method of claim 4, wherein the release layer is a chromate layer.

6. A method of manufacturing a roll stamp, the method comprising:

manufacturing a cylindrical metal mold including a first debossed pattern formed on an outer side and a first hollow portion formed on an inner side;

arranging dies at a predetermined distance from the cylindrical metal mold;

filling a space between the cylindrical metal mold and the dies with a filler;

manufacturing a cylindrical filler mold including a first embossed pattern formed on an inner circumference and a second hollow portion formed on an inner side by separating the dies and the cylindrical metal mold from the filler;

filling the second hollow portion of the cylindrical filler mold with a metal material; and separating the cylindrical filler mold from the filled metal material.

7. The method of claim 6, wherein the manufacturing of the cylindrical metal mold including the first debossed pattern formed on the outer side and the first hollow portion formed on the inner side includes:

manufacturing a resin mold including a second embossed pattern;

manufacturing a cylindrical resin mold by rolling the resin mold so that the second embossed pattern is placed on an inner circumference side of the cylindrical resin mold;

forming a metal layer layer having a cylindrical shape on an inner circumference of the cylindrical resin mold; and manufacturing the cylindrical metal mold by separating the metal layer having a cylindrical shape from the cylindrical resin mold.

8. The method of claim 7, wherein the metal layer is formed by performing an electroless plating method or an electroplating method in which at least one or more of copper (Cu), nickel (Ni), silver (Ag), chromium (Cr), iron (Fe), and cobalt (Co) is plated.

* * * * *